US012765063B2

(12) United States Patent
Kim et al.

(10) Patent No.: US 12,765,063 B2
(45) Date of Patent: Oct. 13, 2026

(54) DISPLAY DEVICE

(71) Applicant: Samsung Display Co., LTD., Yongin-si (KR)

(72) Inventors: Hae Min Kim, Yongin-si (KR); Young Wan Seo, Yongin-si (KR); Geun Ho Lee, Yongin-si (KR); Kyung Hoon Chung, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 428 days.

(21) Appl. No.: 18/363,937

(22) Filed: Aug. 2, 2023

(65) Prior Publication Data

US 2024/0120345 A1 Apr. 11, 2024

(30) Foreign Application Priority Data

Oct. 11, 2022 (KR) ........................ 10-2022-0130084
Mar. 7, 2023 (KR) ........................ 10-2023-0029941

(51) Int. Cl.
*H01L 27/12* (2006.01)
*G01R 31/28* (2006.01)
(Continued)

(52) U.S. Cl.
CPC ......... *H10D 86/60* (2025.01); *G01R 31/2884* (2013.01); *H10D 86/441* (2025.01); *H10W 90/00* (2026.01)

(58) Field of Classification Search
CPC ..... H10D 86/60; H10D 86/441; H10W 90/00; G01R 31/2884
(Continued)

(56) References Cited

U.S. PATENT DOCUMENTS

2007/0201175 A1* 8/2007 Arai ..................... H10D 89/611 361/56
2013/0062607 A1 3/2013 Yamazaki et al.
(Continued)

FOREIGN PATENT DOCUMENTS

| | | |
|---|---|---|
| CN | 107219660 | 9/2017 |
| KR | 10-2016-0070257 | 6/2016 |
| KR | 10-2104608 | 4/2020 |

OTHER PUBLICATIONS

English Machine Translation of CN 107219660. (Year: 2017).*
(Continued)

*Primary Examiner* — Dzung Tran
(74) *Attorney, Agent, or Firm* — F. CHAU & ASSOCIATES, LLC

(57) ABSTRACT

A display device comprises a display area comprising a plurality of pixels, and a data line and a gate line electrically connected to the plurality of pixels, a non-display area disposed adjacent to the display area, a plurality of pads disposed on a side of the non-display area, a gate control line electrically connected to at least one of the plurality of pads and that supplies a gate control signal, a driving voltage line electrically connected to at least one of the plurality of pads and that supplies a driving voltage, an antistatic circuit electrically connected to the gate control line, a scan driver that generates a gate signal based on a gate control signal received from the gate control line and that supplies the gate signal to the gate line, and a shielding layer integral to the driving voltage line to overlap the top of the antistatic circuit.

20 Claims, 18 Drawing Sheets

(51) Int. Cl.
*H10D 86/40* (2025.01)
*H10D 86/60* (2025.01)
*H10W 90/00* (2026.01)

(58) Field of Classification Search
USPC .............................................................. 257/48
See application file for complete search history.

(56) References Cited

U.S. PATENT DOCUMENTS

| | | | | |
|---|---|---|---|---|
| 2014/0175436 | A1* | 6/2014 | Yamazaki | H10D 86/423<br>257/43 |
| 2019/0285953 | A1 | 9/2019 | Kao et al. | |
| 2020/0393937 | A1* | 12/2020 | Kim | G06F 3/0443 |
| 2021/0083037 | A1* | 3/2021 | Kim | H10K 59/131 |
| 2022/0037299 | A1* | 2/2022 | Lee | H01L 25/0753 |
| 2022/0069573 | A1 | 3/2022 | Kim et al. | |
| 2022/0180784 | A1 | 6/2022 | Liu et al. | |

OTHER PUBLICATIONS

English Machine Translation of KR 2016/0070257. (Year: 2016).*
Extended European Search Report for European Application No. 23202582.5, dated Mar. 7, 2024.

* cited by examiner

DISPLAY DEVICE

CROSS-REFERENCE TO RELATED APPLICATION(S)

This application claims priority to and benefits of Korean Patent Application Nos. 10-2022-0130084 and 10-2023-0029941, filed on Oct. 11, 2022 and Mar. 7, 2023, respectively, in the Korean Intellectual Property Office, the entire contents of which are incorporated herein by reference.

BACKGROUND

1. Technical Field

The disclosure relates to a display device.

2. Description of the Related Art

With the advance of information-oriented society, more and more demands are placed on display devices for displaying images in various ways. For example, display devices are employed in various electronic devices such as smartphones, digital cameras, laptop computers, navigation devices, and smart televisions. In a display device, since each pixel of a display panel may include a light-emitting element capable of emitting light by itself, an image can be displayed without a backlight unit providing light to the display panel.

The display device may include multiple pixels, a display area including data lines and gate lines connected to the pixels, and a non-display area disposed around the display area and including a pad unit and fan-out lines. The non-display area may include an antistatic circuit connected to the fan-out line.

SUMMARY

Aspects of the disclosure provide a display device capable of preventing a threshold voltage shift of a transistor of the antistatic circuit or a lighting circuit by protecting the antistatic circuit or a lighting circuit including an oxide-based transistor.

However, aspects of the disclosure are not restricted to the above recited one or more aspects. The above and other aspects of the disclosure will become more apparent to one of ordinary skill in the art to which the disclosure pertains by referencing the detailed description of the disclosure given below.

According to an embodiment, a display device may include a display area including a plurality of pixels, and a data line and a gate line that are electrically connected to the plurality of pixels, a non-display area disposed adjacent to the display area, a plurality of pads disposed on a side of the non-display area, a gate control line that is electrically connected to at least one of the plurality of pads and that supplies a gate control signal, a driving voltage line that is electrically connected to at least one of the plurality of pads and that supplies a driving voltage, an antistatic circuit electrically connected to the gate control line, a scan driver that generates a gate signal based on a gate control signal received from the gate control line and that supplies the gate signal to the gate line, and a shielding layer integral to the driving voltage line to overlap the top of the antistatic circuit.

The antistatic circuit may include a transistor comprising an oxide-based semiconductor region.

The shielding layer may include a plurality of holes that do not overlap a semiconductor region of the transistor.

The display device may further include a low potential line that is connected to at least one of the plurality of pads and that supplies a low potential voltage. The shielding layer may be integral to the low potential line to overlap the top of the antistatic circuit.

The display device may further include a gate high voltage line that is electrically connected to at least one of the plurality of pads and that supplies a gate high voltage, a first gate low voltage line that is electrically connected to at least one of the plurality of pads and that supplies a first gate low voltage, and a second gate low voltage line that is electrically connected to at least one of the plurality of pads to supply a second gate low voltage lower than the first gate low voltage.

The antistatic circuit may include a first transistor electrically connected between the gate high voltage line and the gate control line, a second transistor electrically connected between the gate control line and the first gate low voltage line, a first resistance line electrically connected between a gate electrode of the first transistor and the gate control line, and a second resistance line electrically connected between a gate electrode of the second transistor and the first gate low voltage line.

The first transistor may include a first bias electrode electrically connected to the second gate low voltage line to overlap the semiconductor region of the first transistor. The second transistor may include a second bias electrode electrically connected to the second gate low voltage line to overlap the semiconductor region of the second transistor.

The shielding layer may overlap a portion of each of the gate high voltage line, and the first and second gate low voltage lines. The plurality of holes of the shielding layer may overlap another portion of each of the gate high voltage line, and the first and second gate low voltage lines.

The display device may further include a DC electrode that is electrically connected to at least one of the plurality of pads and that supplies a DC voltage, a test signal line that is electrically connected to at least one of the plurality of pads and that supplies a test gate signal, and a test transistor that supplies the DC voltage based on the test gate signal to the data line. The DC electrode may overlap the semiconductor region of the test transistor.

The test transistor may include a drain electrode overlapping the DC electrode and electrically connected to the DC electrode, a gate electrode receiving a test gate signal and overlapping a semiconductor region of the test transistor, and a source electrode electrically connected to the data line.

According to an embodiment, a display device may include a substrate, a display area comprising a plurality of pixels, and a data line and a gate line that are connected to the plurality of pixels disposed on the substrate, a non-display area disposed adjacent to the display area, a plurality of pads disposed on a side of the non-display area, a gate control line that is electrically connected to at least one of the plurality of pads and that supplies a gate control signal, an antistatic circuit that is electrically connected to the gate control line and that includes a transistor and a resistance line, a driving voltage line that is electrically connected to at least one of the plurality of pads to supply a driving voltage, a shielding layer integral to the driving voltage line to overlap the transistor and the resistance line. A bias electrode of the transistor may be disposed in a first metal layer of the substrate, a semiconductor region of the transistor may be disposed in an active layer on the first metal layer, a gate electrode of the transistor may be disposed in a second metal layer on the active layer, the resistance line may be disposed in a third metal layer on the second metal layer, the gate control line may be disposed in a fourth metal layer on the third metal layer, and the driving voltage line and the shielding layer may be disposed in a fifth metal layer on the fourth metal layer.

The transistor may include an oxide-based semiconductor region. The shielding layer may overlap the semiconductor region of the transistor.

The shielding layer may include a plurality of holes that do not overlap the semiconductor region of the transistor.

The display device may further include a low potential line that is disposed in the fifth metal layer and that is electrically connected to at least one of the plurality of pads, and that supplies a low potential voltage. The shielding layer may be integral to the low potential line to overlap the top of the antistatic circuit.

The display device may further include a gate high voltage line that is electrically connected to at least one of the plurality of pads and that supplies a gate high voltage, a first gate low voltage line that is electrically connected to at least one of the plurality of pads and that supplies a first gate low voltage, and a second gate low voltage line that is electrically connected to at least one of the plurality of pads and that supplies a second gate low voltage lower than the first gate low voltage.

Each of the gate high voltage, and the first and second gate low voltage lines may include a vertical portion disposed in the fourth metal layer to be electrically connected to at least one of the plurality of pads, and a horizontal portion disposed in the second metal layer to be electrically connected to the antistatic circuit.

The shielding layer may overlap a portion of each of the gate high voltage line, and the first and second low voltage lines. The plurality of holes of the shielding layer may overlap another portion of each of the gate high voltage line, and the first and second gate low voltage lines.

According to an embodiment, a display device may include a display area comprising a plurality of pixels, and a data line and a gate line that are electrically connected to the plurality of pixels, a non-display area disposed adjacent to the display area, a plurality of pads disposed on a side of the non-display area, a DC electrode that is electrically connected to at least one of the plurality of pads and that supplies a DC voltage, a test signal line that is electrically connected to at least one of the plurality of pads and that supplies a test gate signal, and a test transistor that supplies the DC voltage based on the test gate signal to the data line. The DC electrode may overlap the semiconductor region of the test transistor.

The test transistor may include a drain electrode overlapping the DC electrode and electrically connected to the DC electrode, a gate electrode receiving a test gate signal and overlapping a semiconductor region of the test transistor, and a source electrode electrically connected to the data line.

The DC electrode may include a horizontal portion extending in a first direction, and a vertical portion extending from the horizontal portion to overlap a semiconductor region of the test transistor.

According to the display device according to embodiments, by protecting the top of the antistatic circuit including an oxide-based transistor with a shielding layer integrally formed with a driving voltage line and protecting the top of a test transistor including an oxide-based transistor with a DC electrode, a threshold voltage shift of the transistor of the antistatic circuit or the lighting circuit may be prevented.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
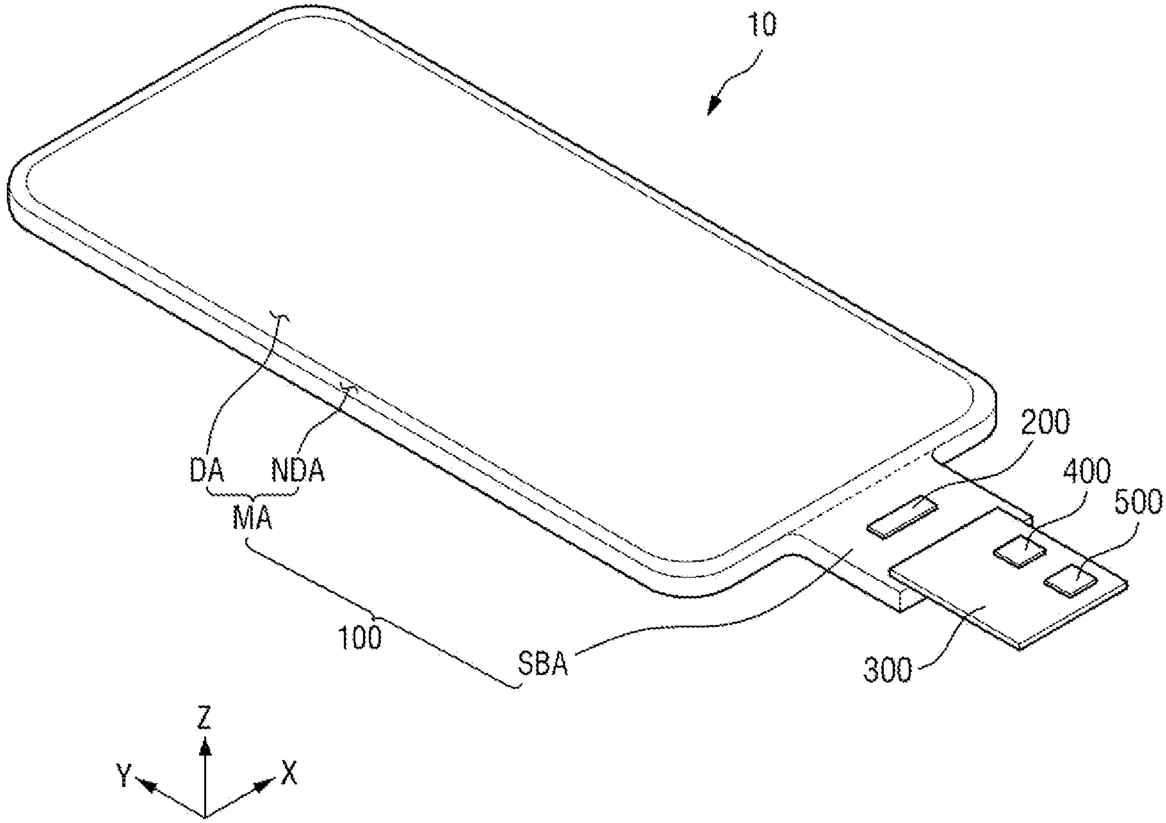
FIG. 1 is a schematic perspective view showing a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods relating to one or more aspects of the disclosure. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the spirit of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there may be no intervening elements or layers present.

It will be understood that the terms "connected to" or "coupled to" may include a physical and/or electrical connection or coupling.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, ZZ, or the like. As used herein, the term "and/or" includes any and all combinations of one or more of the associated listed items. For example, "A and/or B" may be understood to mean any combination including "A, B, or A and B." The terms "and" and "or" may be used in the conjunctive or disjunctive sense and may be understood to be equivalent to "and/or."

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "has,", "have," "having," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

The term "overlap" or "overlapped" means that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules may be physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic perspective view showing a display device according to an embodiment.

Referring to FIG. 1, a display device 10 may be applied to portable electronic devices such as a mobile phone, a smartphone, a tablet personal computer, a mobile communication terminal, an electronic organizer, an electronic book, a portable multimedia player (PMP), a navigation system, an ultra mobile PC (UMPC) or the like. For example, the display device 10 may be applied as a display unit of a television, a laptop, a monitor, a billboard, or an Internet-of-Things (IoT) device. As another example, the display device 10 may be applied to wearable devices such as a smart watch, a watch phone, a glasses type display, or a head mounted display (HMD).

The display device 10 may have a planar shape similar to a quadrilateral shape. For example, the display device 10 may have a shape similar to a quadrilateral shape, in plan view, having short sides in an X-axis direction and long sides in a Y-axis direction. The corner where the short side in the X-axis direction and the long side in the Y-axis direction meet may be rounded to have a predetermined or selected curvature or may be right-angled. The planar shape of the display device 10 is not limited to a quadrilateral shape, and may be formed in a shape similar to another polygonal shape, a circular shape, and/or elliptical shape.

The display device 10 may include a display panel 100, a display driver 200, a circuit board 300, a touch driver 400, and a power supply unit 500.

The display panel 100 may include a main region MA and a sub-region SBA.

The main region MA may include a display area DA including pixels displaying an image and a non-display area NDA disposed adjacent to (e.g., around) the display area DA. The display area DA may emit light from multiple emission areas or multiple opening areas. For example, the display panel 100 may include a pixel circuit including switching elements, a pixel defining layer defining an emission area or an opening area, and a self-light-emitting element.

For example, the self-light-emitting element may include at least one of an organic light-emitting diode including an organic light-emitting layer, a quantum dot light-emitting diode including a quantum dot light-emitting layer, an inorganic light-emitting diode including an inorganic semiconductor, and a micro light-emitting diode (micro LED), but is not limited thereto.

The non-display area NDA may be an area outside the display area DA. The non-display area NDA may be defined as an edge area of the main region MA of the display panel 100. The non-display area NDA may include a scan driver (not illustrated) that supplies gate signals to the gate lines, and fan-out lines (not illustrated) that connect the display driver 200 to the display area DA.

The sub-region SBA may extend from a side of the main region MA. The sub-region SBA may include a flexible material which can be bent, folded and/or rolled. For example, in case that the sub-region SBA is bent, the sub-region SBA may overlap the main region MA in a thickness direction (Z-axis direction). The sub-region SBA may include the display driver 200 and the pad unit (a plurality of pads) connected to the circuit board 300. Optionally, the sub-region SBA may be omitted, and the display driver 200 and the pad unit may be arranged in the non-display area NDA.

The display driver 200 may output signals and voltages for driving the display panel 100. The display driver 200 may supply data voltages to data lines. The display driver 200 may supply a power voltage to the power line and may supply a gate control signal to the scan driver. The display driver 200 may be formed as an integrated circuit (IC) and mounted on the display panel 100 by a chip on glass (COG) method, a chip on plastic (COP) method, and/or an ultrasonic bonding method. For example, the display driver 200 may be disposed in the sub-region SBA, and may overlap the main region MA in the thickness direction (Z-axis direction) by bending of the sub-region SBA. As another example, the display driver 200 may be mounted on the circuit board 300.

The circuit board 300 may be attached to the pad unit of the display panel 100 by using an anisotropic conductive film (ACF). Lead lines of the circuit board 300 may be electrically connected to a pad unit of the display panel 100. The circuit board 300 may be a flexible printed circuit board, a printed circuit board, or a flexible film such as a chip on film.

A touch driver 400 may be mounted on the circuit board 300. The touch driver 400 may be electrically connected to a touch sensing unit of the display panel 100. The touch driver 400 may supply a touch driving signal to multiple touch electrodes of the touch sensing unit and may sense an amount of change in capacitance between the touch electrodes. For example, the touch driving signal may be a pulse signal having a predetermined or selected frequency. The touch driver 400 may calculate whether an input is made and input coordinates based on an amount of change in capacitance between the touch electrodes. The touch driver 400 may be formed of an integrated circuit (IC).

A power supply unit 500 may be disposed on the circuit board 300 to supply power voltage to the display driver 200 and the display panel 100. The power supply unit 500 may generate and supply a driving voltage to a driving voltage line, generate and supply an initialization voltage to the initialization voltage line, and generate and supply a common voltage to a common electrode common to light-emitting elements of multiple pixels. For example, the driving voltage may be a high potential voltage for driving the light-emitting element, and the common voltage may be a low potential voltage for driving the light-emitting element. The power supply unit 500 may generate and supply a DC voltage, a reference voltage, a gate high voltage, and a gate low voltage to the display panel 100.

Figure 2:
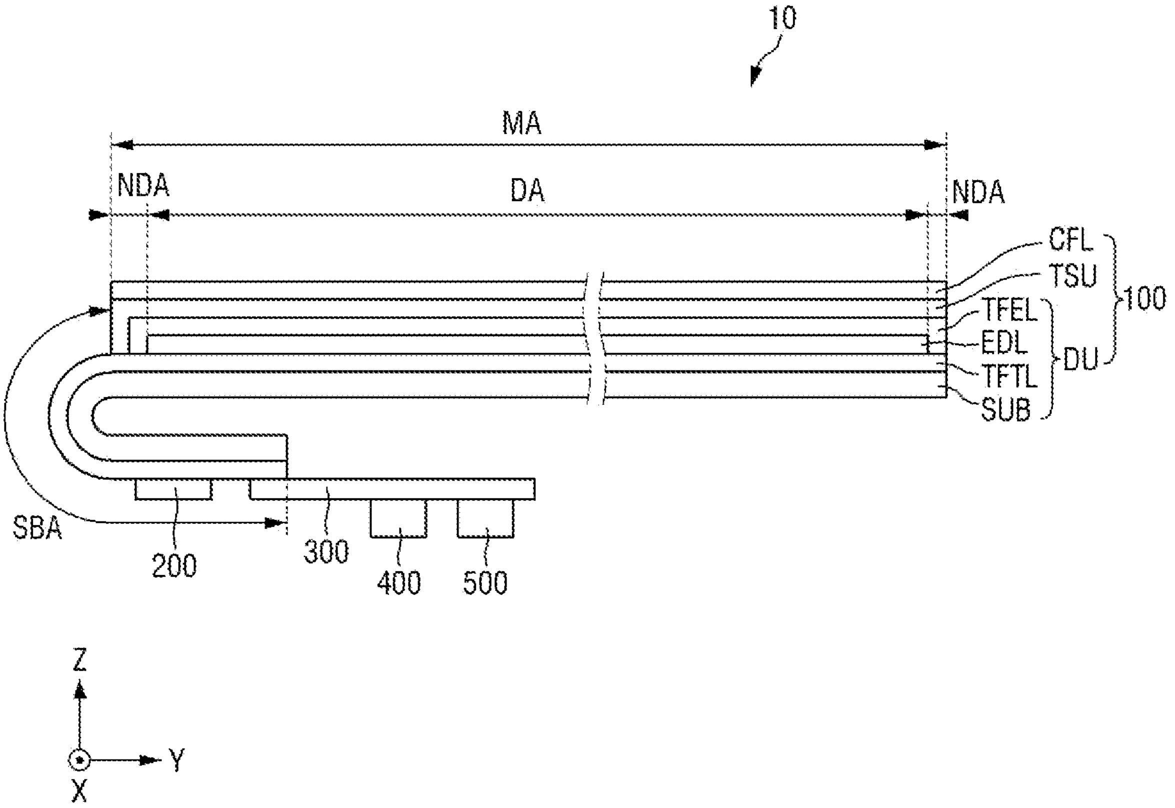
FIG. 2 is a schematic cross-sectional view illustrating a display device according to an embodiment.

FIG. 2 is a schematic cross-sectional view illustrating a display device according to an embodiment.

Referring to FIG. 2, the display panel 100 may include a display unit DU, a touch sensing unit TSU, and a color filter layer CFL. The display unit DU may include a substrate SUB, a thin film transistor layer TFTL, a light-emitting element layer EDL, and an encapsulation layer TFEL.

The substrate SUB may be a base substrate or a base member. The substrate SUB may be a flexible substrate which can be bent, folded or rolled. For example, the substrate SUB may include polymer resin such as polyimide (PI), but is not limited thereto. As another example, the substrate SUB may include a glass material or a metal material.

The thin film transistor layer TFTL may be disposed on the substrate SUB. The thin film transistor layer TFTL may include multiple thin film transistors constituting a pixel circuit of pixels. The thin film transistor layer TFTL may further include gate lines, data lines, power lines, gate control lines, fan-out lines that connect the display driver 200 to the data lines, and lead lines that connect the display driver 200 to the pad unit. Each of the thin film transistors may include a semiconductor region, a source electrode, a drain electrode, and a gate electrode. For example, in case that the scan driver is formed on a side of the non-display area NDA of the display panel 100, the scan driver may include thin film transistors.

The thin film transistor layer TFTL may be disposed in the display area DA, the non-display area NDA, and the sub-region SBA. Thin film transistors, gate lines, data lines, and power lines of each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light-emitting element layer EDL may be disposed on the thin film transistor layer TFTL. The light-emitting element layer EDL may include multiple light-emitting elements in which a pixel electrode, a light-emitting layer, and a common electrode are stacked on each other to emit light, and a pixel defining layer defining pixels. Multiple light-emitting elements of the light-emitting element layer EDL may be disposed in the display area DA.

For example, the light-emitting layer may be an organic light-emitting layer including an organic material. The light-emitting layer may include a hole transporting layer, an organic light-emitting layer, and an electron transporting layer. In case that the pixel electrode receives a predetermined or selected voltage through the thin film transistor of the thin film transistor layer TFTL and the common electrode receives the cathode voltage, holes and electrons may be transferred to the organic light-emitting layer through the hole transporting layer and the electron transporting layer, respectively, and may be combined with each other to emit light in the organic light-emitting layer. For example, the pixel electrode may be an anode electrode, and the common electrode may be a cathode electrode, but the disclosure is not limited thereto.

As another example, the light-emitting elements may include quantum-dot light-emitting diodes each including a quantum-dot emissive layer, inorganic light-emitting diodes each including an inorganic semiconductor, or micro light-emitting diodes.

An encapsulation layer TFEL may cover the upper and side surfaces of the light-emitting element layer EDL, and can protect the light-emitting element layer EDL. The encapsulation layer TFEL may include at least one inorganic layer and at least one organic layer for encapsulating the light-emitting element layer EDL.

The touch sensing unit TSU may be disposed on the encapsulation layer TFEL. The touch sensing unit TSU may include multiple touch electrodes for sensing a user's touch by capacitive sensing, and touch lines connecting the touch electrodes with the touch driver 400. For example, the touch sensing unit TSU may sense a user's touch by mutual capacitance sensing or self-capacitance sensing.

As another example, the touch sensing unit TSU may be disposed on a separate substrate disposed on the display unit DU. The substrate supporting the touch sensing unit TSU may be a base member encapsulating the display unit DU.

The touch electrodes of the touch sensing unit TSU may be disposed in a touch sensor area overlapping with the display area DA. The touch lines of the touch sensing unit TSU may be disposed in a touch peripheral area overlapping with the non-display area NDA.

The color filter layer CFL may be disposed on the touch sensing unit TSU. The color filter layer CFL may include multiple color filters associated with the emission areas, respectively. Each of the color filters may selectively transmit light of a particular wavelength and block or absorb lights of other wavelengths. The color filter layer CFL may absorb some light introduced from the outside of the display device 10 to reduce the reflection of external light. Accordingly, the color filter layer CFL can prevent distortion of colors due to the reflection of external light.

Since the color filter layer CFL is disposed directly on the touch sensing unit TSU, the display device 10 may require no separate substrate for the color filter layer CFL. Therefore, the thickness of the display device 10 can be relatively reduced.

The sub-region SBA of the display panel 100 may be extended from a side of the main region MA. The sub-region SUB may include a flexible material that can be bent, folded, and/or rolled. For example, in case that the sub-region SBA is bent, the sub-region SBA may overlap the main region MA in the thickness direction (z-axis direction). The sub-region SBA may include pad units electrically connected to the display driver 200 and the circuit board 300.

Figure 3:
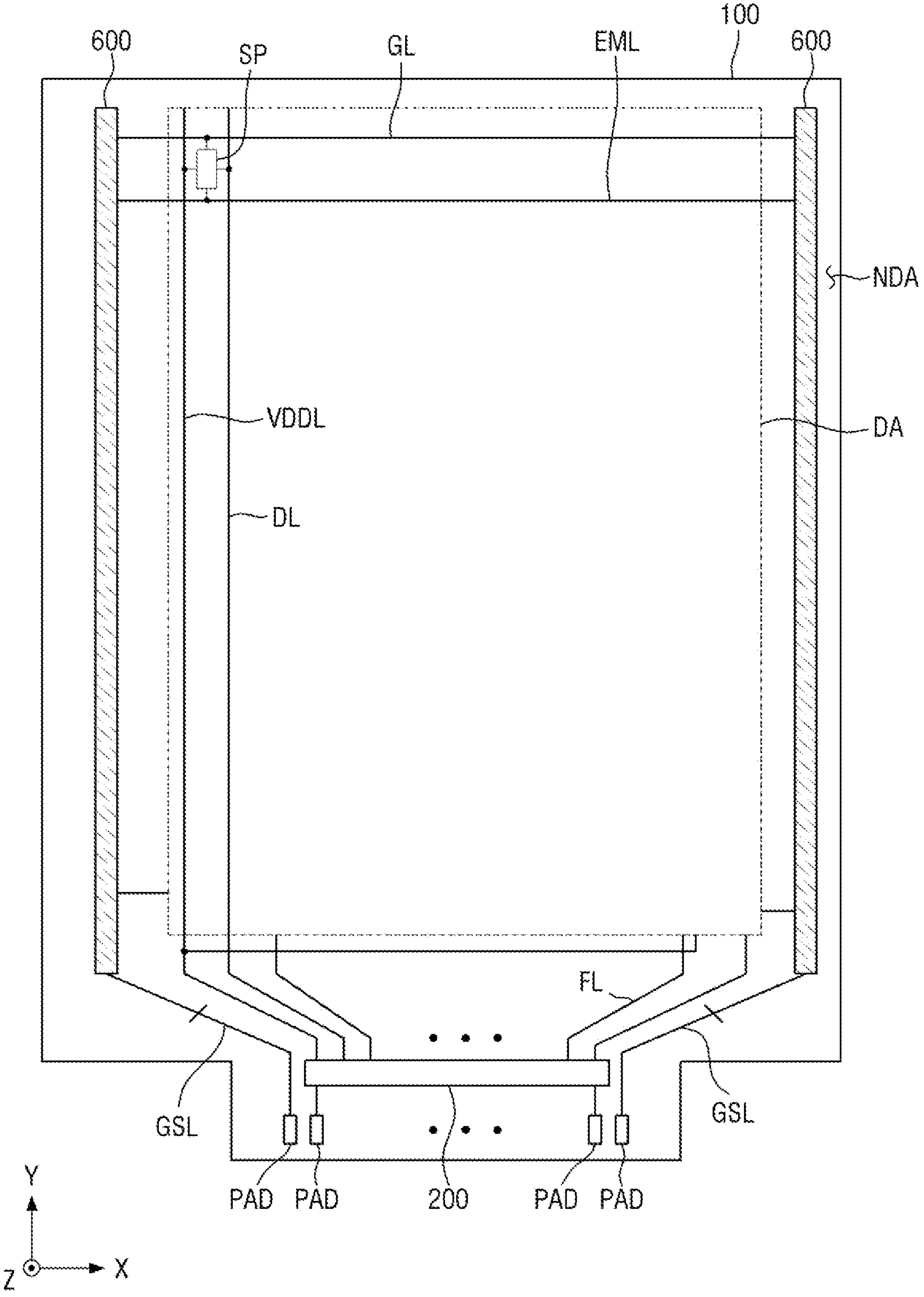
FIG. 3 is a schematic view illustrating a display unit of a display device according to an embodiment.
Figure 4:
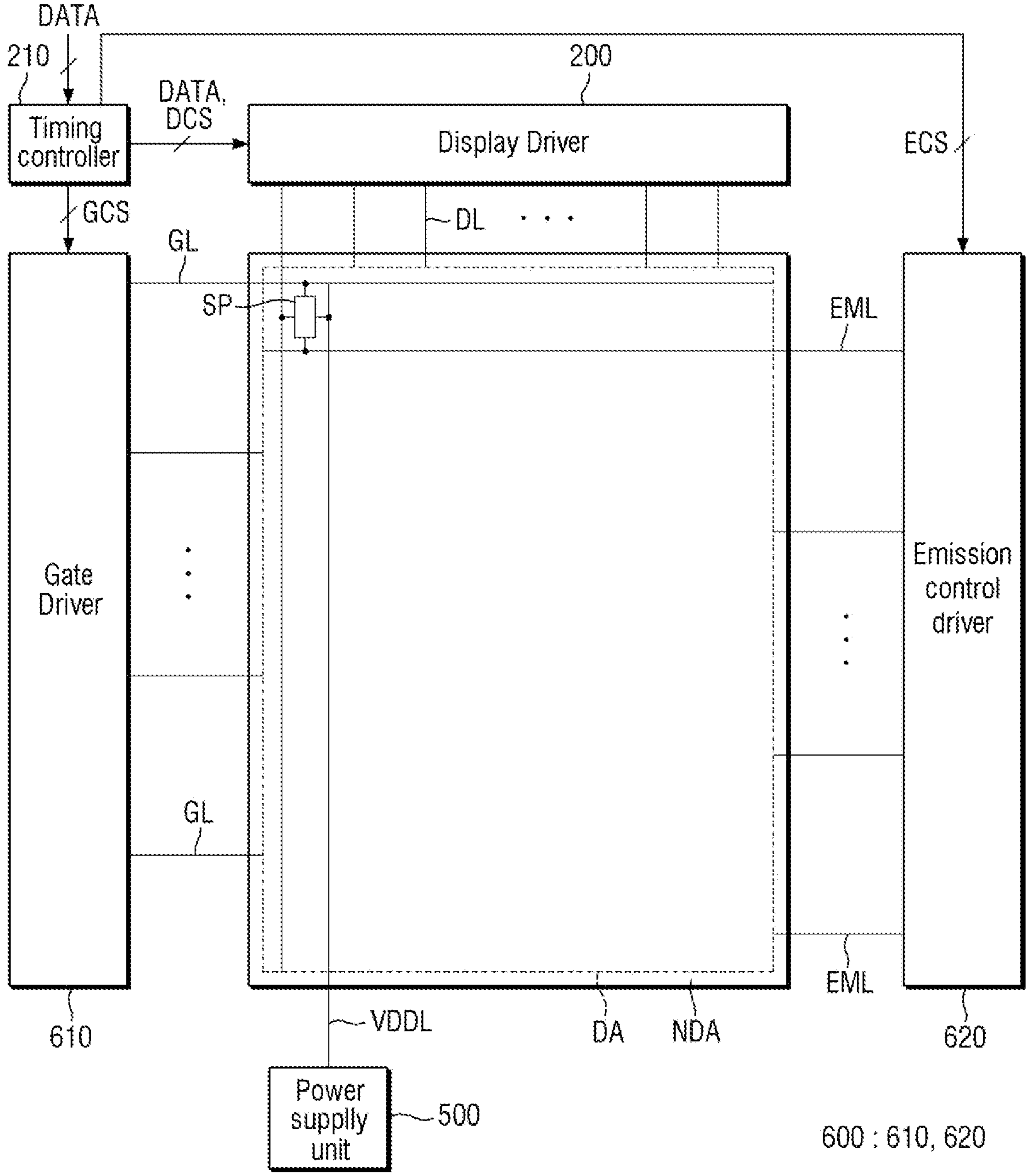
FIG. 4 is a schematic block diagram illustrating a display panel and a display driver according to an embodiment.

FIG. 3 is a schematic plan view illustrating a display unit of a display device according to an embodiment, and FIG. 4 is a schematic block diagram illustrating a display panel and a display driver according to an embodiment.

Referring to FIGS. 3 and 4, the display panel 100 may include the display area DA and the non-display area NDA.

The display area DA may include multiple pixels SP, and multiple driving voltage lines VDDL, multiple gate lines GL, multiple emission control lines EML, and multiple data lines DL connected to the pixels SP.

Each of the pixels SP may be connected to the gate line GL, the data line DL, the emission control line EML, and the driving voltage line VDDL. Each of the pixels SP may include at least one transistor, a light-emitting element and a capacitor.

The gate lines GL may extend in the X-axis direction and may be spaced apart from each other in the Y-axis direction that crosses the X-axis direction. The gate lines GL may sequentially supply gate signals to the pixels SP.

The emission control lines EML may extend in the X-axis direction and may be spaced apart from each other in the Y-axis direction. The emission control lines EML may sequentially supply emission signals to the pixels SP.

The data lines DL may extend in the Y-axis direction and may be spaced apart from each other in the X-axis direction. The data lines DL may supply the data voltage to the pixels SP. The data voltage may determine the luminance of each of the pixels SP.

The driving voltage lines VDDL may extend in the Y-axis direction and may be spaced apart from each other in the X-axis direction. The driving voltage lines VDDL may supply a driving voltage to the pixels SP. The driving voltage may be a high potential voltage for driving the light-emitting elements of the pixels SP.

The non-display area NDA may surround the display area DA. The non-display area NDA may include a scan driver 600, fan-out lines FL, and gate control lines GSL.

The fan-out lines FL may extend from the display driver 200 to the display area DA. The fan-out lines FL may supply the data voltage received from the display driver 200 to the data lines DL.

The gate control lines GSL may extend from the display driver 200 to the scan driver 600. The gate control lines GSL may supply a gate control signal GCS and an emission control signal ECS received from the circuit board 300 to the scan driver 600 through a pad unit PAD.

The sub-region SBA may extend from a side of the non-display area NDA. The sub-region SBA may include the display driver 200 and the pad unit PAD. The pad unit PAD may be disposed closer to an edge of the sub-region SBA than the display driver 200. The pad unit PAD may be electrically connected to the circuit board 300 through an anisotropic conductive film (ACF).

A timing controller 210 may receive digital video data DATA and timing signals. The timing controller 210 may generate a data control signal DCS based on the timing signals to control the operation timing of the display driver 200, generate a gate control signal GCS to control the operation timing of a gate driver 610, and generate an emission control signal ECS to control the operation timing of an emission control driver 620. The timing controller 210 may supply the gate control signal GCS to the gate driver 610 through gate control lines GSL and the emission control signal ECS to the emission control driver 620 through the gate control lines GSL. The timing controller 210 may output digital video data DATA and data control signal DCS to the display driver 200.

The display driver 200 may convert the digital video data DATA into analog data voltages and supply them to the data lines DL through fan-out lines FL. The gate signals of the gate driver 610 may select pixels SP to which the data voltage is supplied, and the selected pixels SP may receive the data voltage through the data lines DL.

The power supply unit 500 may be disposed on the circuit board 300 to supply power voltage to the display driver 200 and the display panel 100. The power supply unit 500 may generate and supply a driving voltage to the driving voltage line VDDL, generate and supply an initialization voltage to the initialization voltage line, and generate and supply a common voltage to a common electrode that is common to light-emitting elements of multiple pixels.

The scan driver 600 may include the gate driver 610 and the emission control driver 620. The scan driver 600 may be disposed on both sides of the non-display area NDA, but the position of the scan driver 600 is not limited thereto.

The gate driver 610 may include multiple transistors that generate gate signals based on the gate control signal GCS. The emission control driver 620 may include multiple transistors that generate emission signals based on the emission control signal ECS. Each of the gate control signal GCS and emission control signal ECS may include a start signal, a clock signal, a gate high voltage, a gate low voltage, and a power voltage. For example, the transistors of the gate driver 610 and the transistors of the emission control driver 620 may be formed on the same layer as the transistors of each of the pixels SP. The gate driver 610 may supply gate signals to the gate lines GL, and the emission control driver 620 may supply emission signals to the emission control lines EML.

Figure 5:
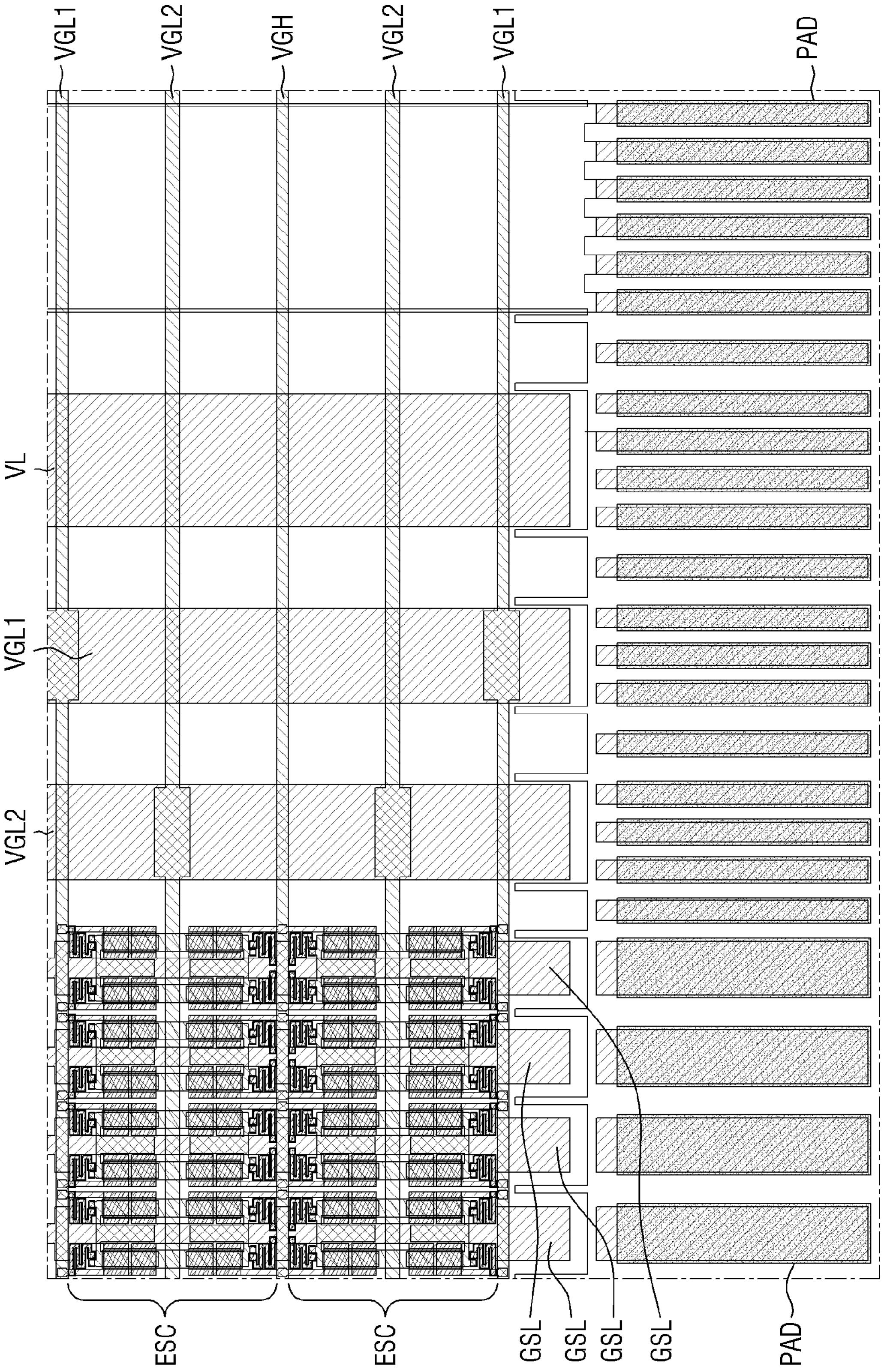
FIG. 5 is a schematic plan view illustrating a part of a non-display area of a display device according to an embodiment.
Figure 6:
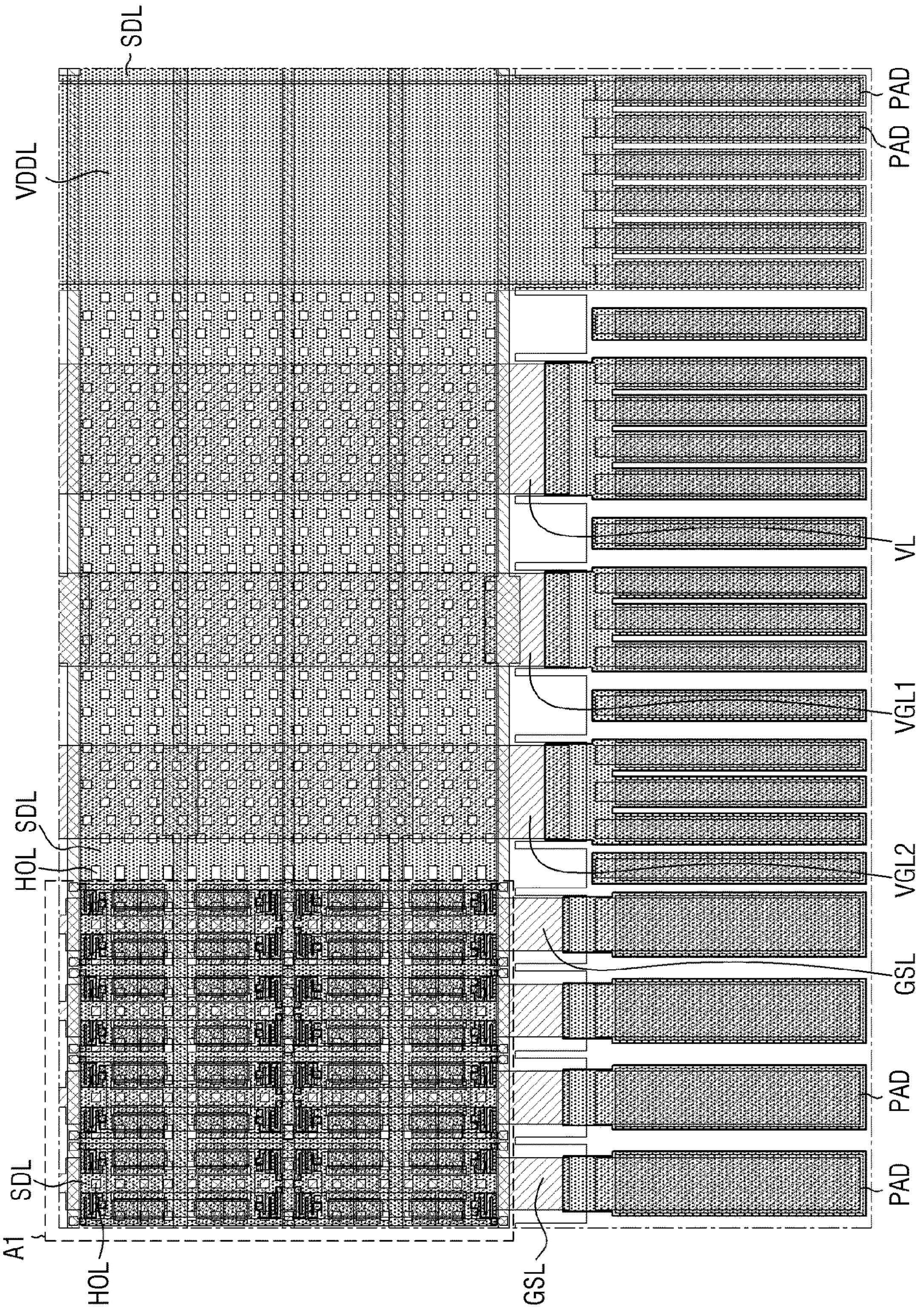
FIG. 6 is a schematic view in which a fifth metal layer is added to the non-display area of FIG. 5.
Figure 7:
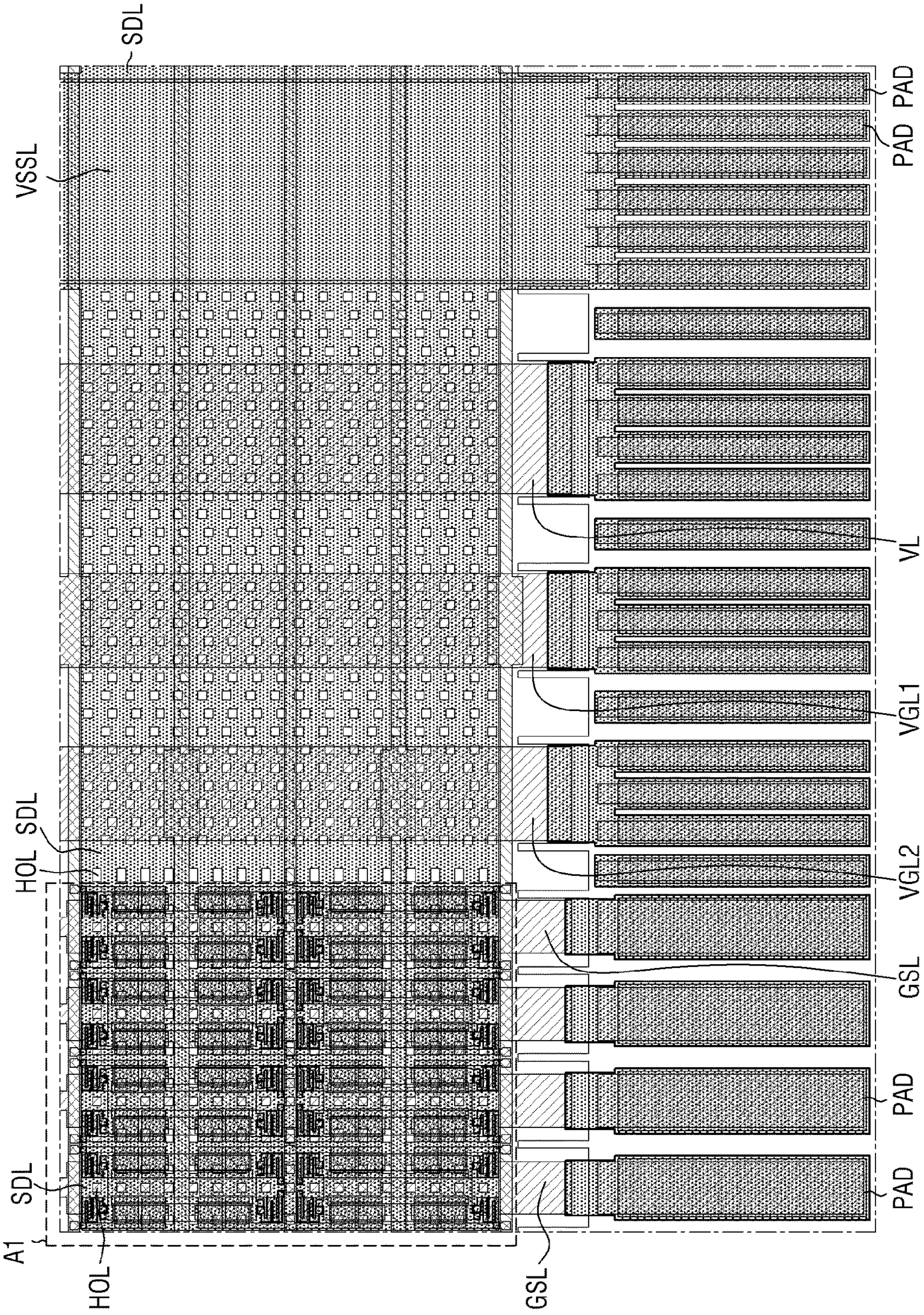
FIG. 7 is a schematic view in which a fifth metal layer according to another example is added to the non-display area of FIG. 5.
Figure 8:
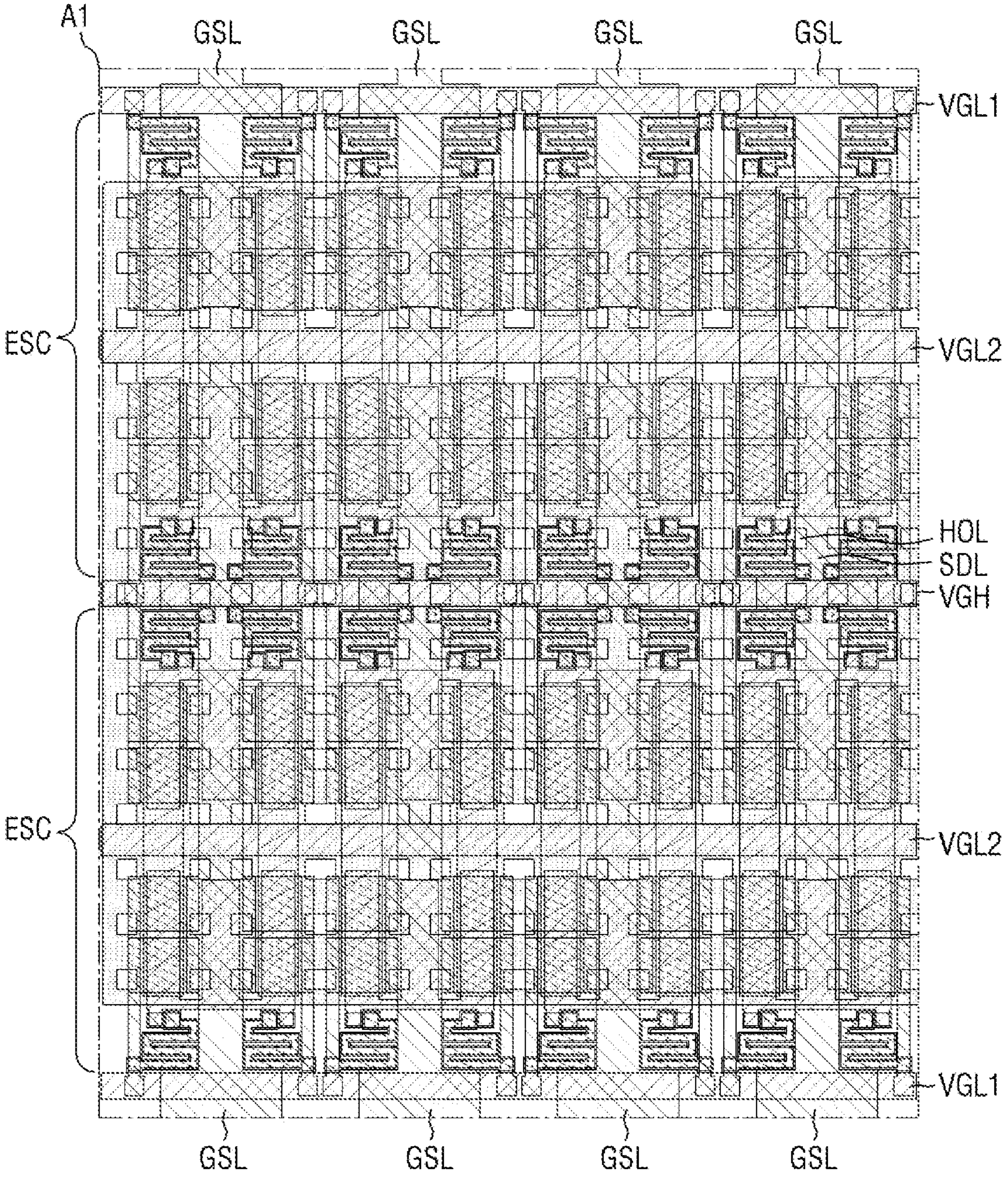
FIG. 8 is an enlarged schematic view of area A1 of FIGS. 6 and 7.

FIG. 5 is a schematic plan view illustrating a part of a non-display area of a display device according to an embodiment, and FIG. 6 is a schematic view in which a fifth metal layer is added to the non-display area of FIG. 5. FIG. 7 is a schematic view in which a fifth metal layer according to another example is added to the non-display area of FIG. 5, and FIG. 8 is an enlarged schematic view of area A1 of FIGS. 6 and 7.

Referring to FIGS. 5 to 8, the pad unit PAD may be electrically connected to the circuit board 300 to receive the gate control signal GCS, the emission control signal ECS, the gate high voltage, a first gate low voltage, a second gate low voltage, a driving voltage, a common voltage, an initialization voltage, a reference voltage, and a DC voltage.

The pad unit PAD may be electrically connected to the gate control lines GSL to supply the gate control signal GCS and the emission control signal ECS. The pad unit PAD may be electrically connected to a first gate low voltage line VGL1 to supply a first gate low voltage. The first gate low voltage line VGL1 may include a vertical portion and a horizontal portion disposed in different layers and electrically connected to each other. Here, the horizontal portion may extend in the X-axis direction, and the vertical portion may extend in the Y-axis direction. For example, the vertical portion of the first gate low voltage line VGL1 may be disposed in a fourth metal layer MTL4 of FIG. 12 and the horizontal portion of the first gate low voltage line VGL1 may be disposed in a second metal layer MTL2 of FIG. 12, but the stacked structure of the vertical portion and the horizontal portion is not limited thereto. The vertical portion of the first gate low voltage line VGL1 may be electrically connected to the pad unit PAD and extend to the scan driver 600, and the horizontal portion of the first gate low voltage line VGL1 may supply the first gate low voltage to an antistatic circuit ESC.

The pad unit PAD may be electrically connected to a second gate low voltage line VGL2 to supply the second gate low voltage. The second gate low voltage may be lower than the first gate low voltage, but is not limited thereto. The second gate low voltage line VGL2 may include a vertical portion and a horizontal portion disposed in different layers and electrically connected to each other. The vertical portion of the second gate low voltage line VGL2 may be electrically connected to the pad unit PAD and extend to the scan driver 600, and the horizontal portion of the second gate low voltage line VGL2 may supply the second gate low voltage to the antistatic circuit ESC.

The pad unit PAD may be electrically connected to a gate high voltage line VGH to supply a gate high voltage. The gate high voltage line VGH may include a vertical portion (not shown) and a horizontal portion disposed in different layers and electrically connected to each other. The vertical portion (not illustrated) of the gate high voltage line VGH may be electrically connected to the pad unit PAD and extend to the scan driver 600, and the horizontal portion may supply the gate high voltage to the antistatic circuit ESC.

The pad unit PAD may be electrically connected to a voltage line VL to supply a power voltage. The voltage line VL may extend to the scan driver 600 and supply an initialization voltage or a reference voltage to the scan driver 600.

In FIG. 6, the pad unit PAD may be electrically connected to the driving voltage line VDDL to supply a driving voltage or a high potential voltage. The driving voltage line VDDL may be disposed in a fifth metal layer MTL5 of FIG. 12, but the stacked structure of the driving voltage line VDDL is not limited thereto. The driving voltage line VDDL may include a shielding layer SDL extending in the X-axis direction. The shielding layer SDL may be integrally formed with (integral to) the driving voltage line VDDL to receive a driving voltage or a high potential voltage from the driving voltage line VDDL. The shielding layer SDL may overlap the voltage line VL, the first and second gate low voltage lines VGL1 and VGL2, the gate high voltage line VGH, and the antistatic circuits ESC. The antistatic circuit ESC may include a transistor including an oxide-based semiconductor region. The shielding layer SDL may protect the antistatic circuits ESC to prevent a threshold voltage shift (Vth shift) of the transistor of the antistatic circuit ESC by covering the top of the antistatic circuits ESC.

In FIG. 7, the pad unit PAD may be electrically connected to the low potential line VSSL to supply a low potential voltage. The low potential voltage may correspond to the common voltage supplied to the common electrode of the pixel SP. The low potential line VSSL may be disposed in the fifth metal layer MTL5 of FIG. 12, but the stacked structure of the low potential line VSSL is not limited thereto. The low potential line VSSL and the driving voltage line VDDL may be formed on the same layer in the same process. The low potential line VSSL may include a shielding layer SDL extending in the X-axis direction. The shielding layer SDL may be integrally formed with the low potential line VSSL to receive a low potential voltage from the low potential line VSSL. Even in the case where the shielding layer SDL receives a low potential voltage, the shielding layer SDL may protect the antistatic circuits ESC to prevent a threshold voltage shift (Vth shift) of the transistor of the antistatic circuit ESC by covering the top of the antistatic circuits ESC.

The shielding layer SDL may include multiple holes HOL. The shielding layer SDL may be disposed on the organic layer in the form of a tank electrode. Since the shielding layer SDL includes multiple holes HOL, it is possible to prevent the shielding layer SDL from being lifted from the organic layer. The holes HOL may not overlap a semiconductor region of a transistor of the antistatic circuit ESC. Accordingly, the shielding layer SDL may protect the semiconductor region of the transistor of the antistatic circuit ESC from light or electromagnetic waves while including the holes HOL.

Figure 9:
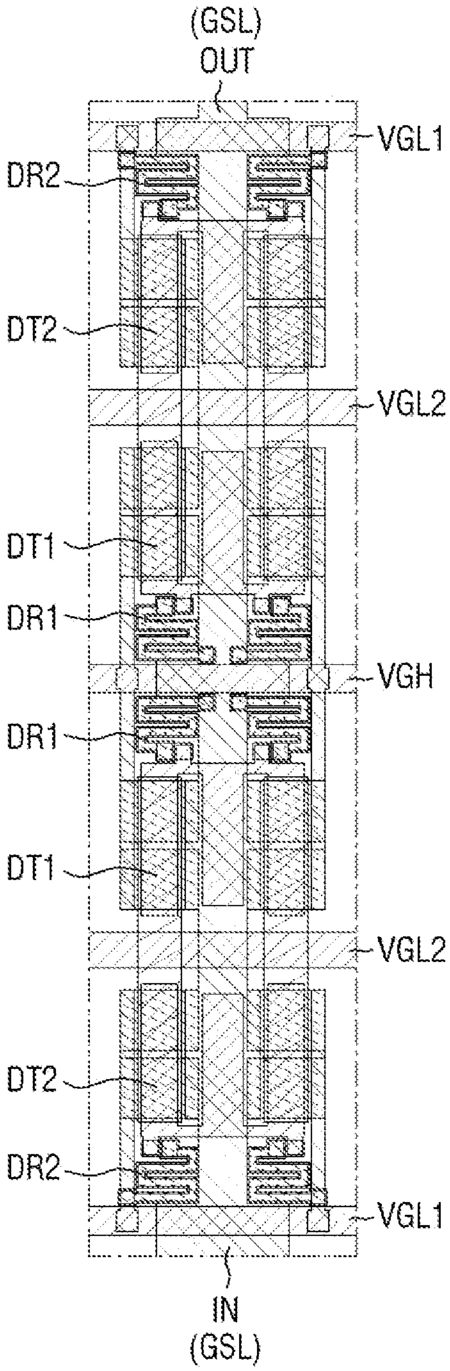
FIG. 9 is a schematic plan view illustrating multiple antistatic circuits in a display device according to an embodiment.
Figure 10:
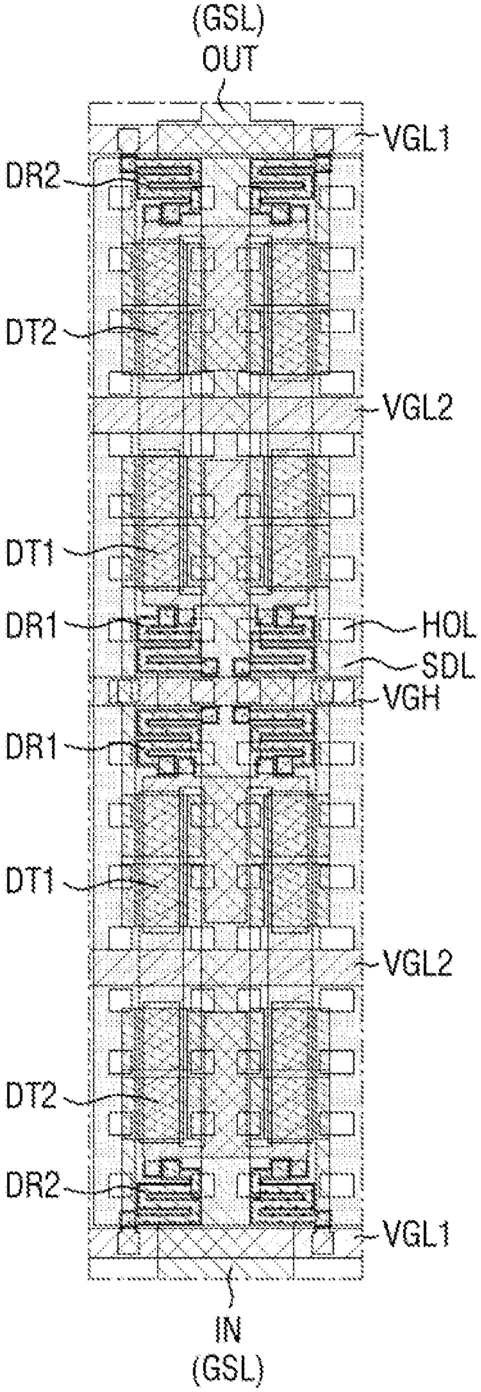
FIG. 10 is a schematic view in which a shielding layer is added to the antistatic circuits of FIG. 9.
Figure 11:
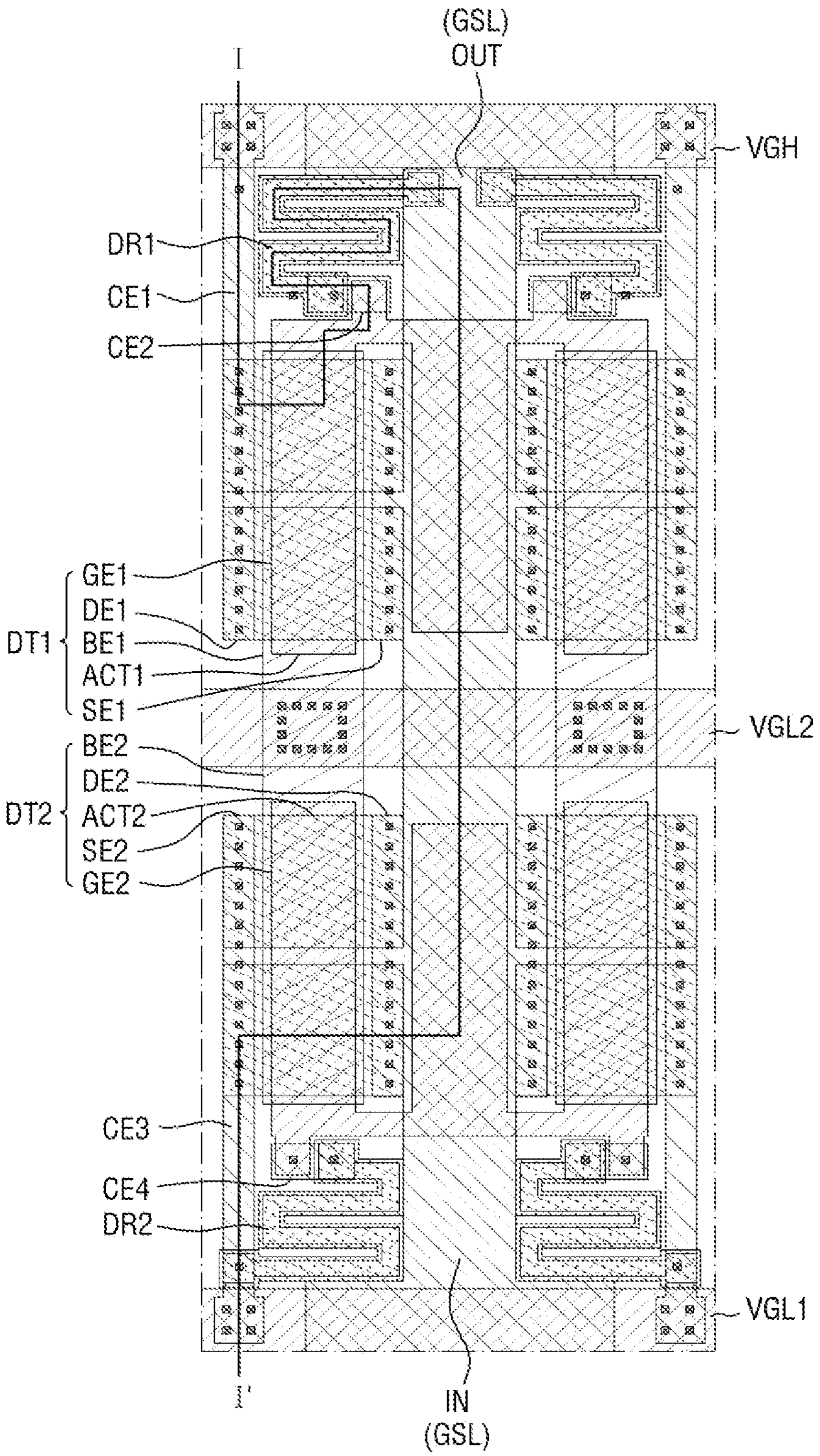
FIG. 11 is a schematic plan view illustrating an antistatic circuit in a display device according to an embodiment.
Figure 12:
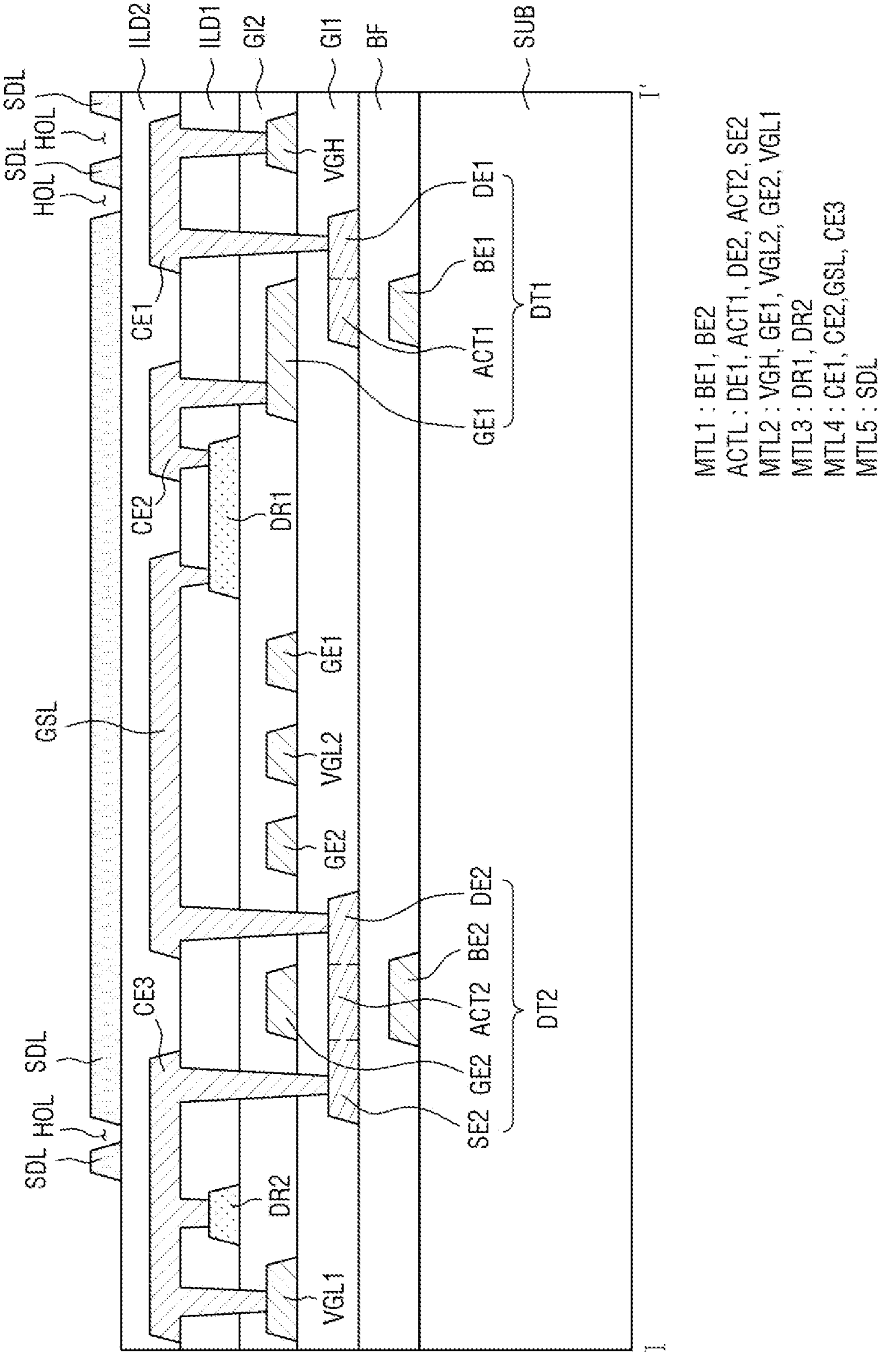
FIG. 12 is a schematic cross-sectional view taken along line I-I' of FIG. 11.
Figure 13:
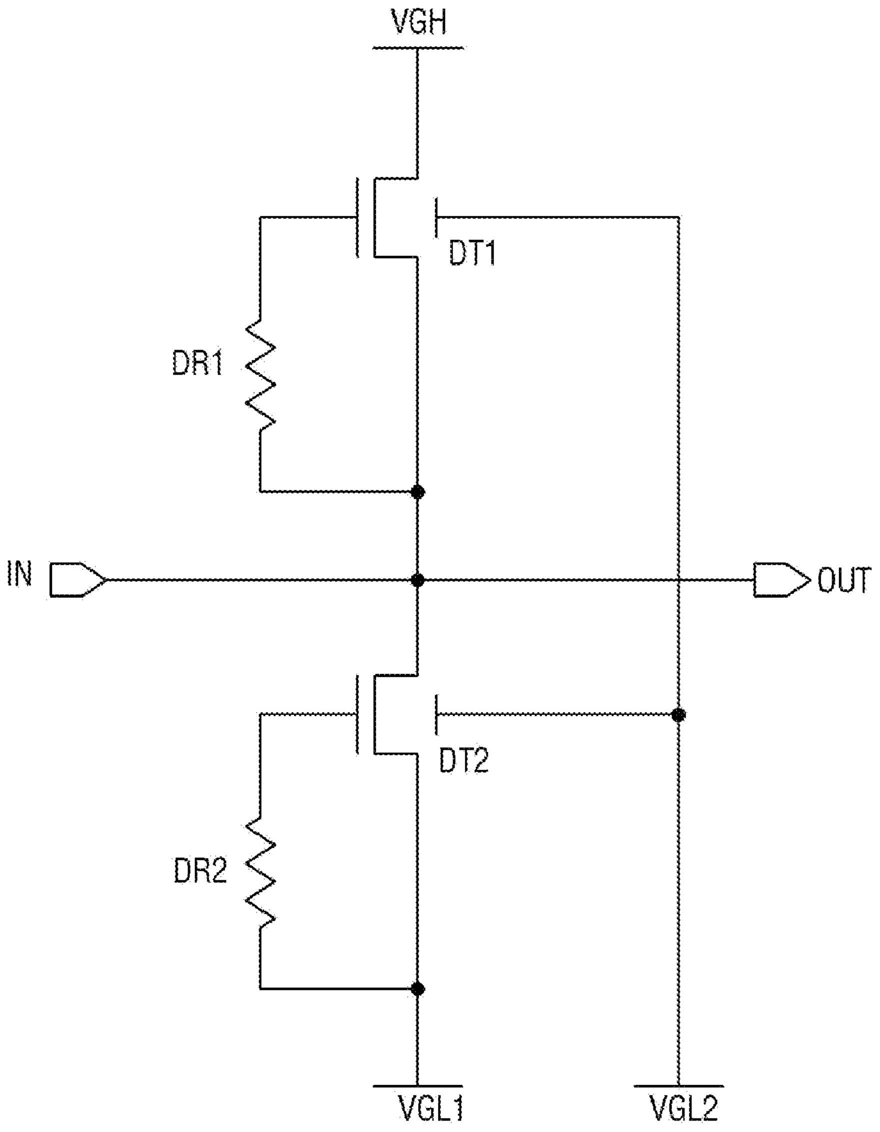
FIG. 13 is a schematic circuit diagram illustrating an antistatic circuit in a display device according to an embodiment.

FIG. 9 is a schematic plan view illustrating multiple antistatic circuits in a display device according to an embodiment, and FIG. 10 is a schematic view in which a shielding layer is added to the antistatic circuits of FIG. 9. FIG. 11 is a schematic plan view illustrating an antistatic circuit in a display device according to an embodiment, FIG. 12 is a schematic cross-sectional view taken along line I-I' of FIG. 11, and FIG. 13 is a schematic circuit diagram illustrating an antistatic circuit in a display device according to an embodiment. FIG. 12 is a view illustrating a state in which the fifth metal layer MTL5 is disposed in a plan view of FIG. 11.

Referring to FIGS. 9 to 13, the antistatic circuit ESC may remove static electricity applied to the gate control line GSL. The antistatic circuit ESC may include first and second transistors DT1 and DT2 and first and second resistance lines DR1 and DR2. The antistatic circuits ESC may be disposed between an input unit IN and an output unit OUT of the gate control line GSL. The input unit IN of the gate control line GSL may receive the gate control signal GCS and the emission control signal ECS from the pad unit PAD, and the output unit OUT may supply the gate control signal GCS and the emission control signal ECS to the scan driver 600. Here, the input unit IN and the output unit OUT of the gate control line GSL are not fixedly defined as specific portions, and may be modified according to the position of the antistatic circuit ESC.

The first transistor DT1 may be connected between the gate high voltage line VGH and the gate control line GSL. A gate electrode GE1 of the first transistor DT1 may be electrically connected to the first resistance line DR1, a drain electrode DE1 may be electrically connected to the gate high voltage line VGH, and a source electrode SE1 may be electrically connected to the gate control line GSL. The first resistance line DR1 may be connected between the gate electrode GE1 of the first transistor DT1 and the gate control line GSL.

The second transistor DT2 may be connected between the first gate low voltage line VGL1 and the gate control line GSL. A gate electrode GE2 of the second transistor DT2 may be electrically connected to the second resistance line DR2, a drain electrode DE2 may be electrically connected to the gate control line GSL, and a source electrode SE2 may be electrically connected to the first gate low voltage line VGL1. The second resistance line DR2 may be connected between the gate electrode GE2 of the second transistor DT2 and the gate control line GSL.

In FIGS. 11 and 12, the display panel 100 may include a substrate SUB, a first metal layer MTL1, a buffer layer BF, an active layer ACTL, a first gate insulating layer GI1, a second metal layer MTL2, a second gate insulating layer GI2, a third metal layer MTL3, a first interlayer insulating layer ILD1, a fourth metal layer MTL4, a second interlayer insulating layer ILD2, and a fifth metal layer MTL5.

The substrate SUB may be a base substrate or a base member. The substrate SUB may be a flexible substrate which can be bent, folded and/or rolled. For example, the substrate SUB may include a glass material or a metal material, but is not limited thereto. As another example, the substrate SUB may include a polymer resin such as polyimide (PI).

The first metal layer MTL1 may be disposed on a substrate SUB. The first metal layer MTL1 may include first and second bias electrodes BE1 and BE2. The first bias electrode BE1 may be electrically connected to the second gate low voltage line VGL2 to receive the second gate low voltage from the second gate low voltage line VGL2. The first bias electrode BE1 may supply a back bias voltage to the first transistor DT1 by overlapping a semiconductor region ACT1 of the first transistor DT1.

The second bias electrode BE2 may be electrically connected to the second gate low voltage line VGL2 to receive the second gate low voltage from the second gate low voltage line VGL2. The second bias electrode BE2 may supply a back bias voltage to the second transistor DT2 by overlapping a semiconductor region ACT2 of the second transistor DT2.

The buffer layer BF may be disposed on the first metal layer MTL1 and the substrate SUB. The buffer layer BF may include an inorganic insulating material capable of preventing permeation of air or moisture. The buffer layer BF may include at least one of a silicon nitride layer, a silicon oxynitride layer, a silicon oxide layer, a titanium oxide layer, an aluminum oxide layer, and an amorphous silicon layer, but is not limited thereto.

The active layer ACTL may be disposed on the buffer layer BF. The active layer ACTL may include the semiconductor region ACT1, the drain electrode DE1, and the source electrode SE1 of the first transistor DT1, and the semiconductor region ACT2, the drain electrode DE2, and the source electrode SE2 of the second transistor DT2.

The semiconductor region ACT1 of the first transistor DT1 may overlap the gate electrode GE1 and may be insulated from the gate electrode GE1 by the first gate insulating layer GI1. The semiconductor region ACT1 of the first transistor DT1 may include an oxide-based material. The first transistor DT1 may have a coplanar structure in which the gate electrode is disposed at the top thereof. The first transistor DT1 may correspond to an n-type transistor. The drain electrode DE1 and the source electrode SE1 of the first transistor DT1 may be provided by making a material of the semiconductor region ACT1 conductive.

The semiconductor region ACT2 of the second transistor DT2 may overlap the gate electrode GE2 and may be insulated from the gate electrode GE2 by the first gate insulating layer GI1. The semiconductor region ACT2 of the second transistor DT2 may include an oxide-based material. The second transistor DT2 may have a coplanar structure in which the gate electrode is disposed at the top thereof. The second transistor DT2 may correspond to an n-type transistor. The drain electrode DE2 and the source electrode SE2 of the second transistor DT2 may be provided by making a material of the semiconductor region ACT2 conductive.

The first gate insulating layer GI1 may be disposed on the active layer ACTL. The first gate insulating layer GI1 may insulate the active layer ACTL and the second metal layer MTL2 from each other. The first gate insulating layer GI1 may include at least one of a silicon nitride layer, a silicon oxynitride layer, a silicon oxide layer, a titanium oxide layer, an aluminum oxide layer, and an amorphous silicon layer, but is not limited thereto.

The second metal layer MTL2 may be disposed on the first gate insulating layer GI1. The second metal layer MTL2 may include the first and second gate low voltage lines VGL1 and VGL2, the gate high voltage line VGH, the gate electrode GE1 of the first transistor DT1, and the gate electrode GE2 of the second transistor DT2.

The second gate insulating layer GI2 may be disposed on the second metal layer MTL2. The second gate insulating layer GI2 may insulate the second and third metal layers MTL2 and MTL3 from each other. The second gate insulating layer GI2 may contain the materials discussed herein in association with the first gate insulating layer GI1.

The third metal layer MTL3 may be disposed on the second gate insulating layer GI2. The third metal layer MTL3 may include first and second resistance lines DR1 and DR2. The first resistance line DR1 may be connected between the gate electrode GE1 of the first transistor DT1 and the gate control line GSL. The second resistance line DR2 may be connected between the gate electrode GE2 of the second transistor DT2 and the gate control line GSL.

The first interlayer insulating layer ILD1 may be disposed on the third metal layer MTL3. The first interlayer insulating layer ILD1 may insulate the third and fourth metal layers MTL3 and MTL4 from each other.

The fourth metal layer MTL4 may be disposed on the first interlayer insulating layer ILD1. The fourth metal layer MTL4 may include first to fourth connection electrodes CE1 to CE4.

The first connection electrode CE1 may electrically connect the gate high voltage line VGH and the drain electrode DE1 of the first transistor DT1. The second connection electrode CE2 may electrically connect the first resistance line DR1 and the gate electrode GE1 of the first transistor DT1. The third connection electrode CE3 may electrically connect the first gate low voltage line VGL1 and the source electrode SE2 of the second transistor DT2. The fourth connection electrode CE4 may electrically connect the second resistance line DR2 and the gate electrode GE2 of the second transistor DT2.

The second interlayer insulating layer ILD2 may be disposed on the fourth metal layer MTL4. The second interlayer insulating layer ILD2 may include an organic insulating material such as polyimide (PI), but is not limited thereto.

The fifth metal layer MTL5 may be disposed on the second interlayer insulating layer ILD2. The fifth metal layer MTL5 may include the driving voltage line VDDL and the shielding layer SDL. The shielding layer SDL may be integrally formed with the driving voltage line VDDL to receive a driving voltage or a high potential voltage from the driving voltage line VDDL. The shielding layer SDL may protect the antistatic circuits ESC to prevent a threshold voltage shift (Vth shift) of the transistor of the antistatic circuit ESC by covering the top of the antistatic circuits ESC.

The shielding layer SDL may be formed as a single layer or multiple layers made of at least one of molybdenum (Mo), aluminum (Al), chromium (Cr), gold (Au), titanium (Ti), nickel (Ni), neodymium (Nd), copper (Cu), and an alloy thereof. For example, the shielding layer SDL may have a titanium/aluminum/titanium (Ti/Al/Ti) stacked structure, but is not limited thereto.

The shielding layer SDL may include multiple holes HOL. The shielding layer SDL may be disposed on the second interlayer insulating layer ILD2 in the form of a tank electrode. Since the shielding layer SDL includes the holes HOL, it may be possible to prevent the shielding layer SDL from being lifted from the organic layer. The holes HOL may overlap the antistatic circuit ESC except for the semiconductor region ACT1 of the first transistor DT1 and the semiconductor region ACT2 of the second transistor DT2. Accordingly, the shielding layer SDL may protect the semiconductor region ACT1 of the first transistor DT1 and the second semiconductor region ACT2 of the second transistor DT2 from light or electromagnetic waves while including the holes HOL.

Figure 14:
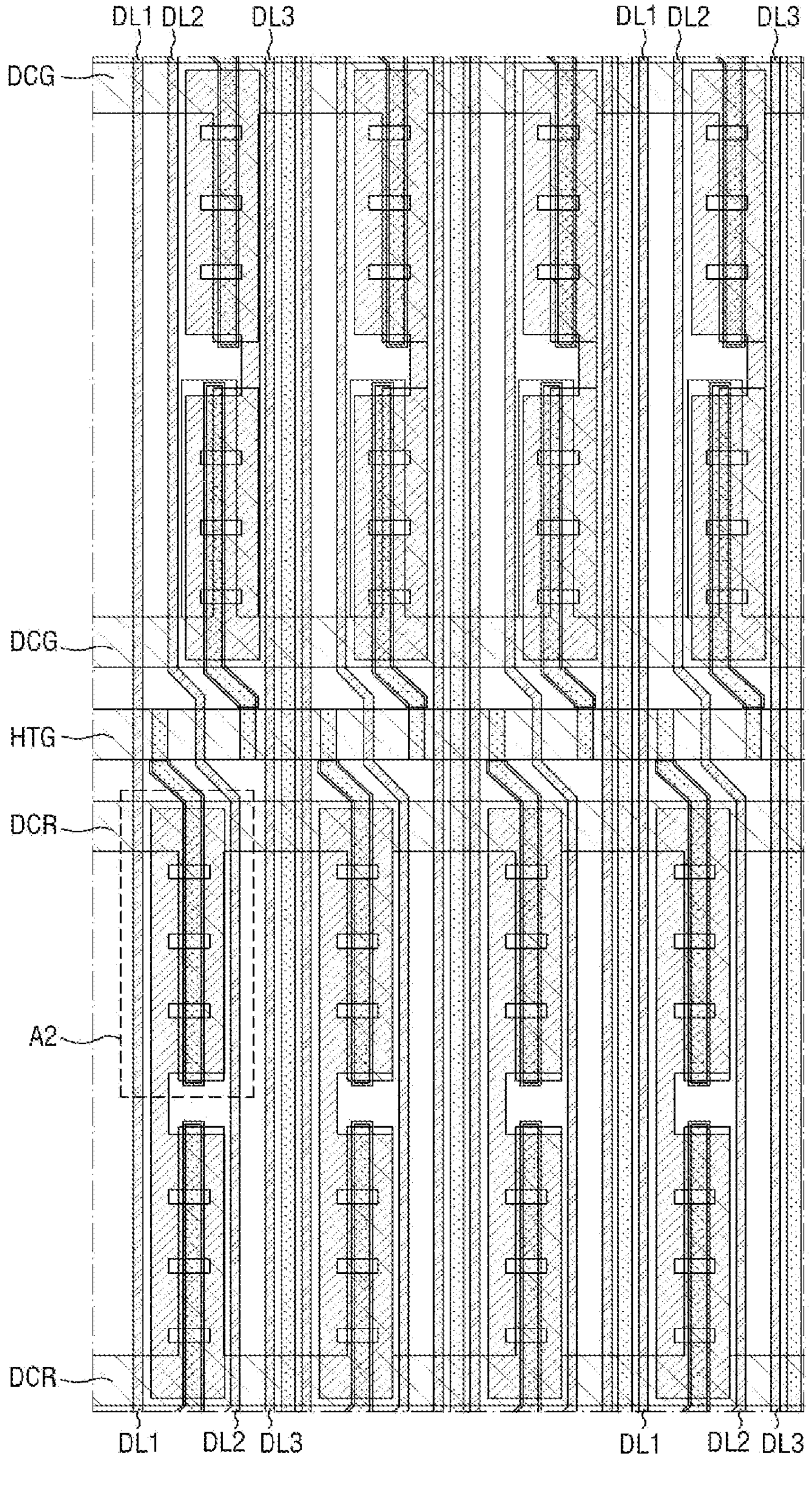
FIG. 14 is a schematic plan view illustrating a lighting circuit according to an embodiment.
Figure 15:
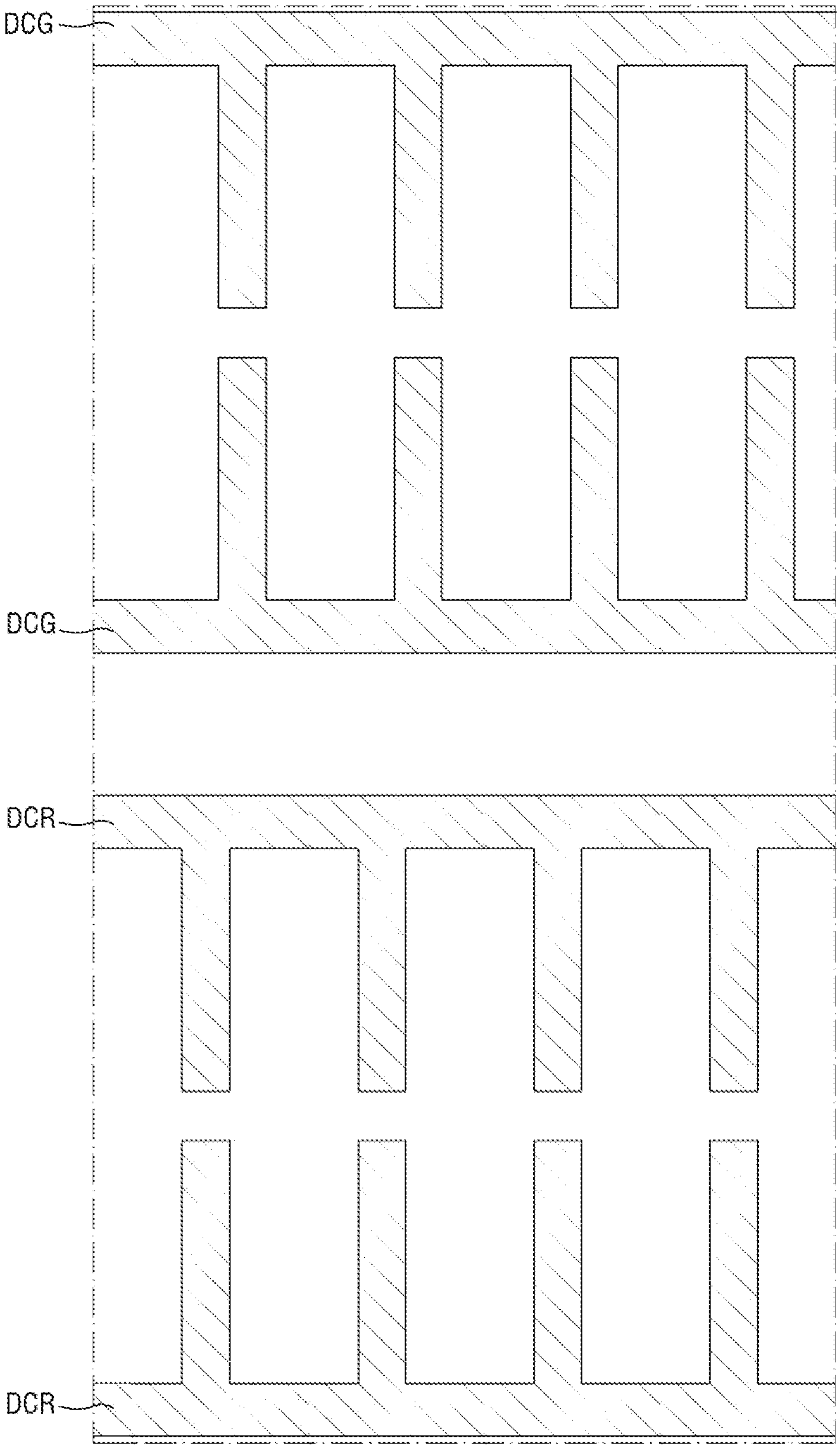
FIG. 15 is a schematic view illustrating first and second DC electrodes in the lighting circuit in a display device according to an embodiment.
Figure 16:
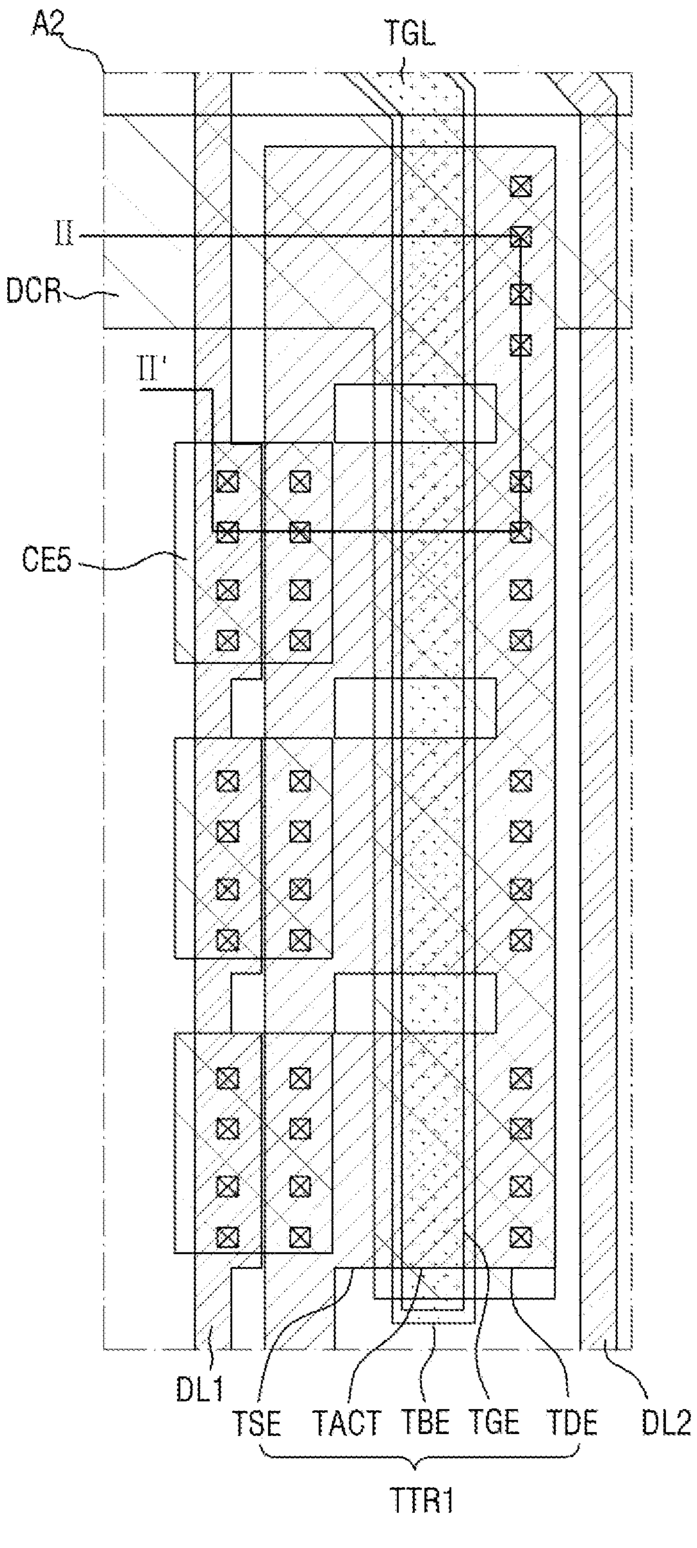
FIG. 16 is an enlarged schematic view of area A2 of FIG. 14.
Figure 17:
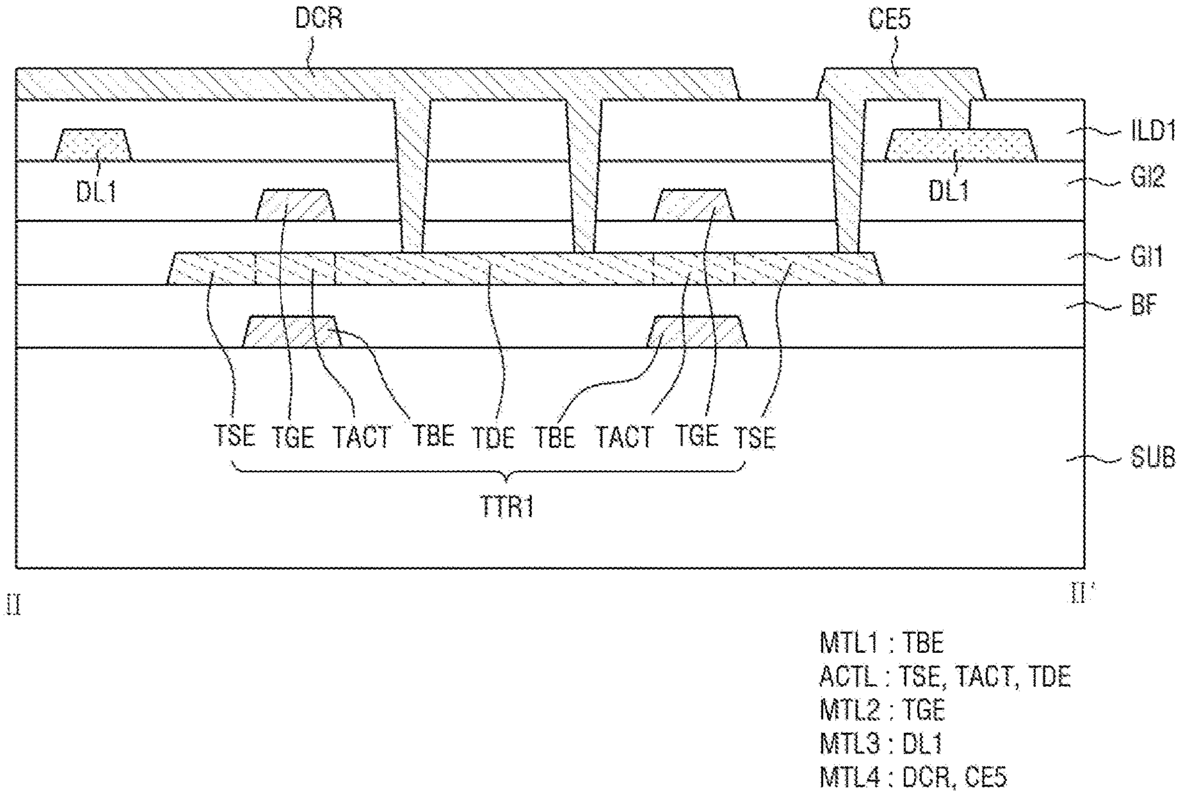
FIG. 17 is a schematic cross-sectional view taken along line II-II' of FIG. 16.
Figure 18:
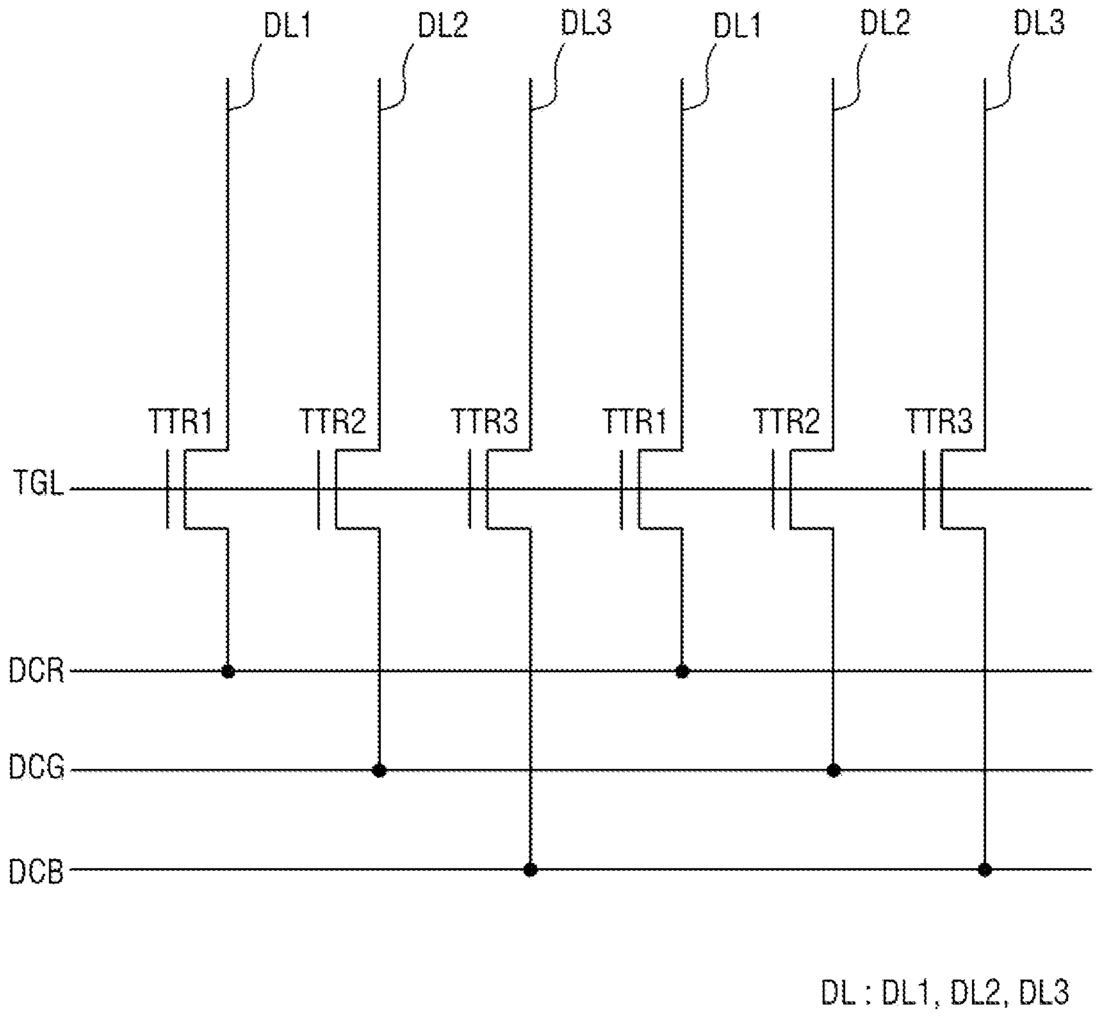
FIG. 18 is a schematic circuit diagram illustrating a lighting circuit in a display device according to an embodiment.

FIG. 14 is a schematic plan view illustrating a lighting circuit according to an embodiment, and FIG. 15 is a schematic view illustrating first and second DC electrodes in the lighting circuit in a display device according to an embodiment. FIG. 16 is an enlarged schematic view of area A2 of FIG. 14, FIG. 17 is a schematic cross-sectional view taken along line II-II' of FIG. 16, and FIG. 18 is a schematic circuit diagram illustrating a lighting circuit in a display device according to an embodiment.

Referring to FIGS. 14 to 18, a lighting circuit of the display device 10 may be disposed in the non-display area NDA or may be removed from the display panel 100 after the lighting test of the display device 10 is completed. The lighting circuit of the display device 10 may include multiple test transistors. The lighting circuit may supply DC voltage to the data lines DL and check the lighting state of the pixels SP.

The lighting circuit may include first to third test transistors TTR1, TTR2, and TTR3. A gate electrode TGE of the first test transistor TTR1 may be electrically connected to a test signal line TGL to receive a test gate signal. The gate electrode TGE of the first test transistor TTR1 may be a part of the test signal line TGL. The test signal line TGL may be connected to a horizontal test signal line HTG to receive the test gate signal. The horizontal test signal line HTG may be disposed in the fourth metal layer MTL4 and extend in the X-axis direction, and the test signal line TGL may be disposed in the second metal layer MTL2 and extend in the Y-axis direction or the opposite direction of the Y-axis direction. The horizontal test signal line HTG and the test signal line TGL may be electrically connected to the pad unit PAD to receive the test gate signal.

A drain electrode TDE, a semiconductor region TACT, and a source electrode TSE of the first test transistor TTR1 may be disposed in the active layer ACTL. The active layer ACTL may include an oxide-based material. The drain electrode TDE of the first test transistor TTR1 may be electrically connected to a first DC electrode DCR to receive a first direct current voltage from the first DC electrode DCR. The source electrode TSE of the first test transistor TTR1 may be electrically connected to the first data line DL1 of the third metal layer MTL3 through a fifth connection electrode CE5 of the fourth metal layer MTL4. As another example, the first data line DL1 may be disposed in a metal layer different from the third metal layer MTL3. Accordingly, the first test transistor TTR1 may supply the first direct current voltage to the first data line DL1 based on the test gate signal. A bias electrode TBE of the first test transistor TTR1 may be disposed in the first metal layer MTL1 and overlap the semiconductor region TACT of the first test transistor TTR1. The bias electrode TBE of the first test transistor TTR1 may supply a back bias voltage to the first test transistor TTR1.

A gate electrode of the second test transistor TTR2 may receive a test gate signal from the test signal line TGL. The drain electrode of the second test transistor TTR2 may be electrically connected to the second DC electrode DCG to receive a second direct current voltage from the second DC electrode DCG. A source electrode of the second test transistor TTR2 may be electrically connected to a second data line DL2. Accordingly, the second test transistor TTR2 may supply the second direct current voltage to the second data line DL2 based on the test gate signal.

A gate electrode of the third test transistor TTR3 may receive a test gate signal from the test signal line TGL. A drain electrode of the third test transistor TTR3 may be electrically connected to the third DC electrode DCB to receive a third direct current voltage from the third DC electrode DCB. A source electrode of the third test transistor TTR3 may be electrically connected to a third data line DL3. Accordingly, the third test transistor TTR3 may supply a third direct current voltage to the third data line DL3 based on the test gate signal.

Each of the first to third DC electrodes DCR, DCG, and DCB may be electrically connected to the pad unit PAD to supply the first to third DC electrodes. Each of the first to third DC electrodes DCR, DCG, and DCB may be disposed in the fourth metal layer MTL4 to supply first to third direct current voltages to the first to third data lines DL1, DL2, and DL3, respectively. Each of the first to third DC electrodes DCR, DCG, and DCB may include a horizontal portion extending in the X-axis direction and a vertical portion extending in the Y-axis direction or in a direction opposite to the Y-axis direction. The vertical portions of the first DC electrode DCR may extend from the horizontal portion of the first DC electrode DCR in a Y-axis direction or in a direction opposite to the Y-axis direction. The vertical portion of the first DC electrode DCR may overlap the semiconductor region TACT and the drain electrode TDE of the first test transistor TTR1. Accordingly, the first DC electrode DCR may protect the first test transistor TTR1 to prevent a threshold voltage shift (Vth shift) of the first test transistor TTR1 by covering the semiconductor region TACT of the first test transistor TTR1.

Each of the first to third DC electrodes DCR, DCG, and DCB may be formed as a single layer or multiple layers made of at least one of molybdenum (Mo), aluminum (Al), chromium (Cr), gold (Au), titanium (Ti), nickel (Ni), neodymium (Nd), copper (Cu), and an alloy thereof. For example, each of the first to third DC electrodes DCR, DCG, and DCB may have a titanium/aluminum/titanium (Ti/Al/Ti) stacked structure, but is not limited thereto.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A display device, comprising:
- a display area comprising:
  - a plurality of pixels; and
  - a data line and a gate line that are electrically connected to the plurality of pixels;
- a non-display area disposed adjacent to the display area;
- a plurality of pads disposed on a side of the non-display area;
- a gate control line that is electrically connected to at least one first pad of the plurality of pads and that supplies a gate control signal;
- a driving voltage line that is electrically connected to at least one second pad of the plurality of pads and that supplies a driving voltage;
- an antistatic circuit electrically connected to the gate control line;
- a scan driver that generates a gate signal based on a gate control signal received from the gate control line and that supplies the gate signal to the gate line; and
- a shielding layer integral to the driving voltage line to overlap the top of the antistatic circuit.

2. The display device of claim 1, wherein the antistatic circuit comprises a transistor comprising an oxide-based semiconductor region.

3. The display device of claim 2, wherein the shielding layer includes a plurality of holes that do not overlap a semiconductor region of the transistor.

4. The display device of claim 1, further comprising:

a low potential line that is electrically connected to at least one third pad of the plurality of pads and that supplies a low potential voltage, wherein the shielding layer is integral to the low potential line to overlap the top of the antistatic circuit.

5. The display device of claim 1, further comprising:

a gate high voltage line that is electrically connected to at least one fourth pad of the plurality of pads and that supplies a gate high voltage;

a first gate low voltage line that is electrically connected to at least one fifth pad of the plurality of pads and that supplies a first gate low voltage; and a second gate low voltage line that is electrically connected to at least one sixth pad of the plurality of pads and that supplies a second gate low voltage lower than the first gate low voltage.

6. The display device of claim 5, wherein the antistatic circuit comprises:

a first transistor electrically connected between the gate high voltage line and the gate control line;

a second transistor electrically connected between the gate control line and the first gate low voltage line;

a first resistance line electrically connected between a gate electrode of the first transistor and the gate control line; and a second resistance line electrically connected between a gate electrode of the second transistor and the first gate low voltage line.

7. The display device of claim 6, wherein the first transistor comprises a first bias electrode electrically connected to the second gate low voltage line to overlap the semiconductor region of the first transistor, and the second transistor comprises a second bias electrode electrically connected to the second gate low voltage line to overlap the semiconductor region of the second transistor.

8. The display device of claim 5, wherein the shielding layer overlaps a portion of each of the gate high voltage line, and the first and second gate low voltage lines, and the shielding layer includes a plurality of holes that overlap another portion of each of the gate high voltage line, and the first and second gate low voltage lines.

9. The display device of claim 1, further comprising:

a DC electrode that is electrically connected to at least one seventh pad of the plurality of pads and that supplies a DC voltage;

a test signal line that is electrically connected to at least one eighth pad of the plurality of pads and that supplies a test gate signal; and a test transistor that supplies the DC voltage based on the test gate signal to the data lines, wherein the DC electrode overlaps a semiconductor region of the test transistor.

10. The display device of claim 9, wherein the test transistor comprises:

a drain electrode overlapping the DC electrode and electrically connected to the DC electrode;

a gate electrode receiving the test gate signal and overlapping a semiconductor region of the test transistor; and a source electrode electrically connected to the data line.

11. A display device, comprising:

a substrate;

a display area comprising:

a plurality of pixels; and a data line and a gate line that are electrically connected to the plurality of pixels disposed on the substrate;

a non-display area disposed adjacent to the display area;

a plurality of pads disposed on a side of the non-display area, a gate control line that is electrically connected to at least one first pad of the plurality of pads and that supplies a gate control signal;

an antistatic circuit that is electrically connected to the gate control line and that comprises a transistor and a resistance line;

a driving voltage line that is electrically connected to at least one second pad of the plurality of pads and that supplies a driving voltage;

a shielding layer integral to the driving voltage line to overlap the transistor and the resistance line, wherein a bias electrode of the transistor is disposed in a first metal layer of the substrate, a semiconductor region of the transistor is disposed in an active layer on the first metal layer, a gate electrode of the transistor is disposed in a second metal layer on the active layer, the resistance line is disposed in a third metal layer on the second metal layer, the gate control line is disposed in a fourth metal layer on the third metal layer, and the driving voltage line and the shielding layer are disposed in a fifth metal layer on the fourth metal layer.

12. The display device of claim 11, wherein the transistor comprises an oxide-based semiconductor region, and the shielding layer overlaps the semiconductor region of the transistor.

13. The display device of claim 12, wherein the shielding layer comprises a plurality of holes that do not overlap the semiconductor region of the transistor.

14. The display device of claim 11, further comprising:

a low potential line that is disposed in the fifth metal layer, that is electrically connected to at least one third pad of the plurality of pads, and that supplies a low potential voltage, wherein the shielding layer is integral to the low potential line to overlap the top of the antistatic circuit.

15. The display device of claim 11, further comprising:

a gate high voltage line that is electrically connected to at least one foruth pad of the plurality of pads and that supplies a gate high voltage;

a first gate low voltage line that is electrically connected to at least one fifth pad of the plurality of pads and that supplies a first gate low voltage; and a second gate low voltage line that is electrically connected to a sixth pad and that supplies a second gate low voltage lower than the first gate low voltage.

16. The display device of claim 15, wherein each of the gate high voltage, and the first and second gate low voltage lines comprise:

a vertical portion disposed in the fourth metal layer to be electrically connected to at least one seventh pad of the plurality of pads; and a horizontal portion disposed in the second metal layer to be electrically connected to the antistatic circuit.

17. The display device of claim 15, wherein the shielding layer overlaps a portion of each of the gate high voltage line, and the first and second low voltage lines, and the plurality of holes of the shielding layer overlap another portion of each of the gate high voltage line, and the first and second gate low voltage lines.

18. An electronic device, comprising:

a display area comprising:

a plurality of pixels; and a data line and a gate line that are electrically connected to the plurality of pixels;

a non-display area disposed adjacent to the display area;

a plurality of pads disposed on a side of the non-display area;

a gate control line that is electrically connected to at least one of the plurality of pads and that supplies a gate control signal;

a driving voltage line that is electrically connected to at least one of the plurality of pads and that supplies a driving voltage, an antistatic circuit electrically connected to the gate control line;

a scan driver that generates a gate signal based on a gate control signal received from the gate control line and that supplies the gate signal to the gate line; and a shielding layer integral to the driving voltage line to overlap the top of the antistatic circuit.

19. The electronic device of claim 18, wherein:

the antistatic circuit comprises a transistor comprising an oxide-based semiconductor region, the driving voltage being a high potential voltage that drives light emitting elements in the display area, and the semiconductor region being a portion of an active layer disposed between a source electrode and a drain electrode.

20. The electronic device of claim 18, further comprising:

a DC electrode that is electrically connected to at least one of the plurality of pads and that supplies a DC voltage;

a test signal line that is electrically connected to at least one of the plurality of pads and that supplies a test gate signal; and a test transistor that supplies the DC voltage based on the test gate signal to the data lines, wherein the DC electrode overlaps a semiconductor region of the test transistor.

* * * * *